US008866516B2

(12) United States Patent  (10) Patent No.: US 8,866,516 B2
Nagai et al.  (45) Date of Patent: Oct. 21, 2014

(54) GATE DRIVE CIRCUIT

(71) Applicant: Panasonic Corporation, Osaka (JP)

(72) Inventors: Shuichi Nagai, Osaka (JP); Daisuke Ueda, Kyoto (JP); Nobuyuki Otsuka, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/062,950

(22) Filed: Oct. 25, 2013

(65) Prior Publication Data

US 2014/0049297 A1  Feb. 20, 2014

Related U.S. Application Data

(63) Continuation of application No. PCT/JP2012/006797, filed on Oct. 24, 2012.

(30) Foreign Application Priority Data

Nov. 1, 2011  (JP) ................................. 2011-240666

(51) Int. Cl.
| | |
|---|---|
| *H03K 17/06* | (2006.01) |
| *H02M 1/08* | (2006.01) |
| *H03K 17/04* | (2006.01) |
| *H03K 17/691* | (2006.01) |
| *H03K 17/0412* | (2006.01) |

(52) U.S. Cl.
CPC ................ *H03K 17/04* (2013.01); *H02M 1/08* (2013.01); *H03K 17/691* (2013.01); *H03K 17/04123* (2013.01)
USPC ............ 327/109; 327/376; 327/377; 327/383

(58) Field of Classification Search
USPC .......... 327/109, 374, 376–377, 379, 383–384
See application file for complete search history.

(56) References Cited

U.S. PATENT DOCUMENTS

| 5,686,854 A | 11/1997 | Smith |
|---|---|---|
| 6,836,161 B2 | 12/2004 | Akiyama et al. |

(Continued)

FOREIGN PATENT DOCUMENTS

| JP | 2001-267905 | 9/2001 |
|---|---|---|
| JP | 2007-311753 | 11/2007 |

(Continued)

OTHER PUBLICATIONS

International Search Report issued Nov. 27, 2012 in International (PCT) Application No. PCT/JP2012/006797.
Andre Kurs, et al.: "Wireless Power Transfer via Strongly Coupled Magnetic Resonances", Science Express, vol. 317, No. 5834, pp. 83-86 (2007).

*Primary Examiner* — An Luu
(74) *Attorney, Agent, or Firm* — Wenderoth, Lind & Ponack, L.L.P.

(57) ABSTRACT

A gate drive circuit includes: an input port for receiving a control signal; an output port; a capacitor connected to the output port; a modulation unit which generates (i) a first modulated signal indicating timing of a first logical value of the control signal and (ii) a second modulated signal indicating timing of at least a second logical value of the control signal; a first electromagnetic resonance coupler which wirelessly transmits the first modulated signal; a second electromagnetic resonance coupler which wirelessly transmits the second modulated signal; a first rectifier circuit which generates a first demodulated signal by demodulating the first modulated signal, and outputs the first demodulated signal to the output port; and a second rectifier circuit which generates a second demodulated signal by demodulating the second modulated signal, and outputs the second demodulated signal to the output port.

21 Claims, 20 Drawing Sheets

(56) References Cited

U.S. PATENT DOCUMENTS

| | | |
|---|---|---|
| 7,482,904 B2 | 1/2009 | Lee et al. |
| 7,692,444 B2 | 4/2010 | Chen et al. |
| 2001/0044640 A1 | 11/2001 | Akiyama et al. |
| 2007/0268106 A1 | 11/2007 | Lee et al. |
| 2014/0009202 A1* | 1/2014 | Nagai et al. .................. 327/374 |

FOREIGN PATENT DOCUMENTS

| | | |
|---|---|---|
| JP | 2008-067012 | 3/2008 |
| JP | 2009-077104 | 4/2009 |

* cited by examiner

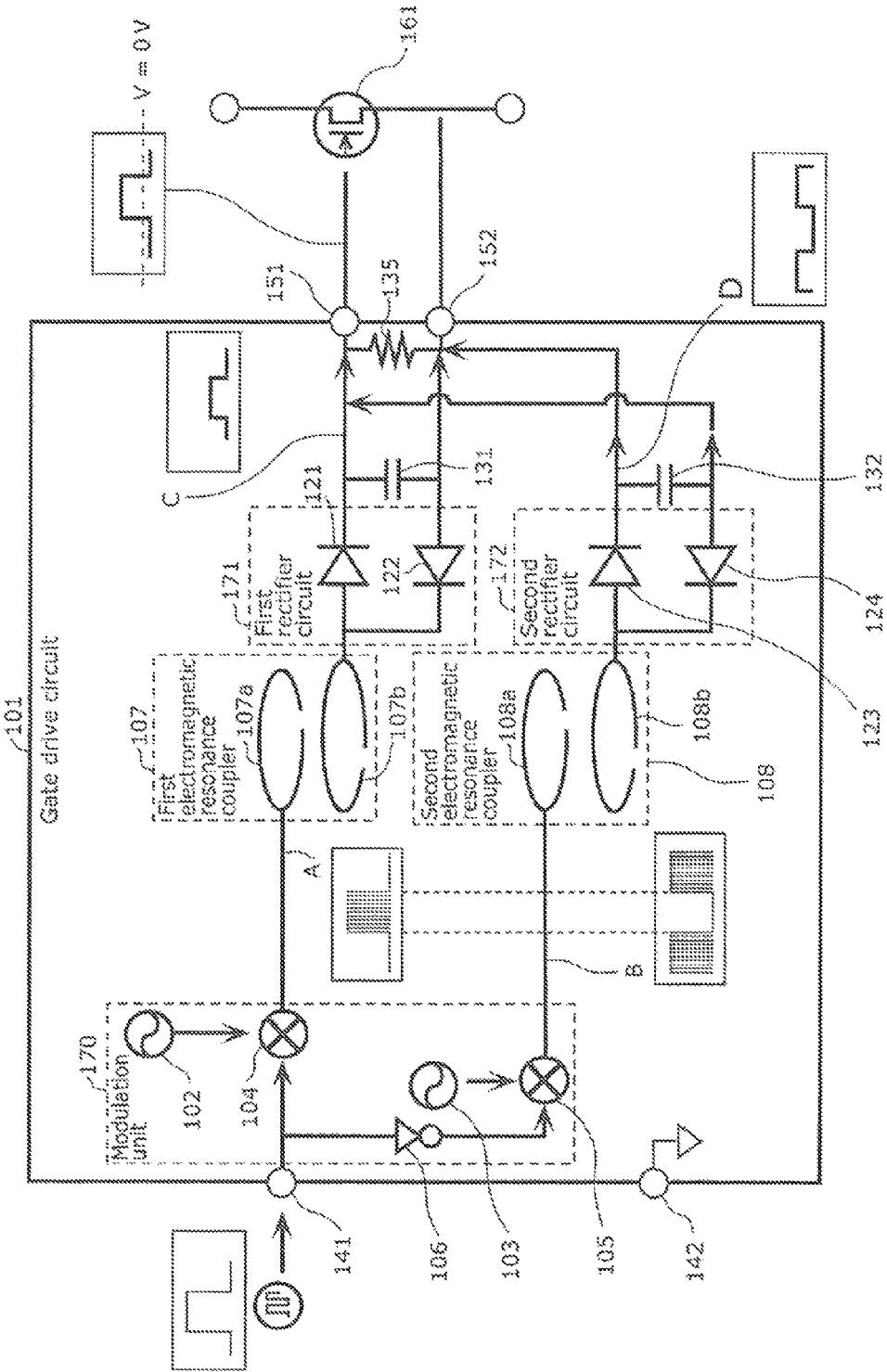

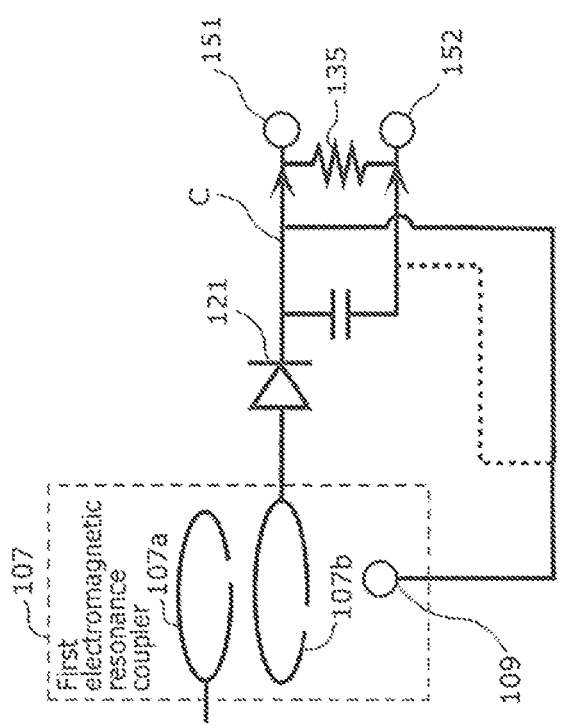

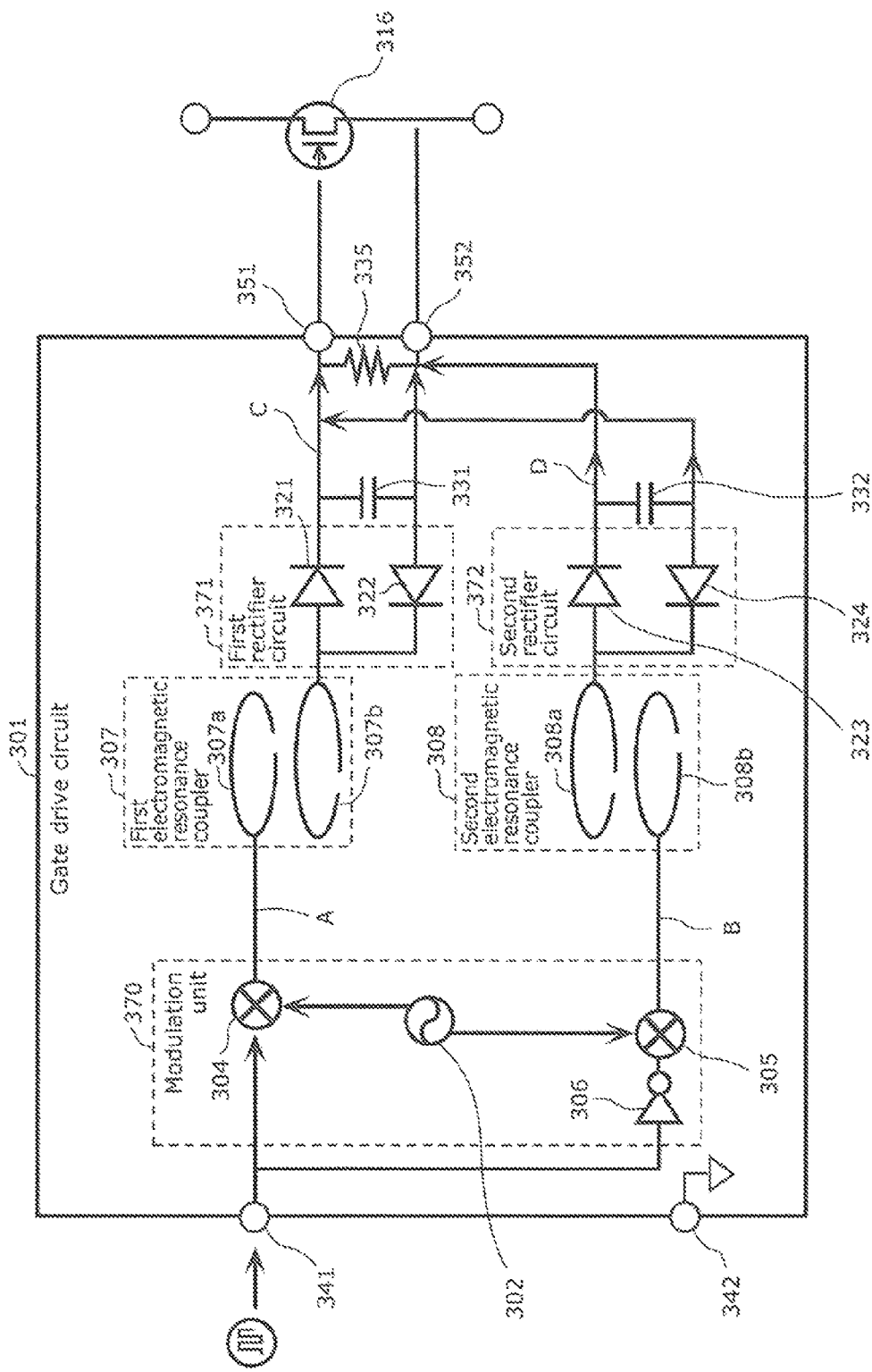

GATE DRIVE CIRCUIT

CROSS REFERENCE TO RELATED APPLICATION

This is a continuation application of PCT International Application No. PCT/JP2012/006797 filed on Oct. 24, 2012, designating the United States of America, which is based on and claims priority of Japanese Patent Application No. 2011-240666 filed on Nov. 1, 2011. The entire disclosures of the above-identified applications, including the specifications, drawings and claims are incorporated herein by reference in their entirety.

FIELD

One or more exemplary embodiments disclosed herein relate generally to a gate drive circuit which drives a gate terminal of a semiconductor switching device, and particularly to a gate drive circuit which has a function to isolate a signal by wireless signal transmission,

BACKGROUND

A gate drive circuit for a semiconductor switching device (or a circuit which drives a semiconductor switching device) is a circuit which drives a gate terminal of the switching device (hereinafter the semiconductor switching device is also simply referred to as "switching device"). Such a gate drive circuit controls ON/OFF of the semiconductor switching device by applying a gate voltage to a gate terminal of, for example, a high withstand voltage switching device such as an insulated gate bipolar transistor (IGBT) called a power semiconductor. A general gate drive circuit includes a P-type transistor and an N-type transistor in an output unit. The P-type transistor operates when the switching device is turned ON from OFF and the N-type transistor operates when the switching device is turned OFF from ON. Specifically, when the switching device is turned OFF from ON, the gate current of the switching device is extracted.

In the above-described gate drive circuit, a reference potential of the power semiconductor switching device, that is the reference voltage on the output side of the gate driving circuit, is very high. Therefore, it is required to isolate a direct-current component between the primary side which is the input unit for receiving a control signal to the gate drive circuit and the output side (secondary side) of the gate drive circuit which drives the switching device. Such an element capable of isolating the direct-current component between the primary side and the secondary side of the element is called a DC isolation device. This is an element necessary to drive the switching device. Furthermore, the above-described electronic circuit element having the DC isolation function is used for isolating the logic ground and the RF ground, and is called a digital isolator (Patent Literature (PTL) 1). Particularly, to drive a power semiconductor switching device, an external isolated power supply is required which requires a very large gate drive circuit also called a gate drive system. Therefore, if it is allowed not only to isolate a gate signal but also to supply isolated power to the gate, the external isolated power supply is no longer required and the gate isolation circuit can be miniaturized.

As a representative signal transmission circuit which realizes the DC isolation function, a configuration which isolates signals via a wireless signal transmission unit such as a pulse transformer is known (for example, see PTL 2). However, the pulse transformer is so large that cannot be used for a semiconductor gate drive circuit. A technique has been proposed in which the gate drive circuit can be planalized and miniaturized to some extent by using a planer spiral inductors facing each other as a wireless signal transmitter, instead of the pulse transformer (for example, see PTL 3).

FIG. 14 illustrates an example of a digital isolator including a spiral inductor for a non-contact signal transmission unit disclosed in PTL 3. The digital isolator includes a transmission circuit chip 2041 in which a transmission circuit is formed, a transmission chip 2043 in which a transmission spiral inductor 2045 is formed, a reception chip 2044 in which a reception spiral inductor 2046 is formed, and a reception circuit chip 2042 in which a demodulation circuit is formed. The transmission circuit chip 2041 and the transmission chip 2043 are connected via a wire 2047. The reception circuit chip 2042 and the reception chip 2044 are also connected via the wire 2047. An input signal is modulated by the transmission circuit chip 2041 to a signal for wireless signal transmission, and is transmitted to the transmission spiral inductor 2045 of the transmission chip 2043. The transmission spiral inductor 2045 and the reception spiral inductor 2046 serve as coils. The transmission spiral inductor 2045 on the transmission chip 2043 and the reception spiral inductor 2046 on the reception chip 2044 are coupled by electromagnetic induction. Therefore, electric power (a current) transmitted to the transmission spiral inductor 2045 is transmitted to the reception spiral inductor 2046 electrically isolated from the transmission spiral inductor 2045. Electric power (a current) generated in the reception spiral inductor 2046 is restored by a receiving circuit on the reception circuit chip 2042, and is retrieved as an output signal. However, since wireless signal (electric power) transmission by such a planer spiral inductor uses electromagnetic induction coupling, there are problems in that transmission efficiency is bad and the withstand voltage is not high due to small air gap between the wires.

Therefore, a technique called electromagnetic resonance coupling (or electromagnetic field resonance coupling) has been reported as a wireless signal transmission technique realizing higher transmission efficiency and higher isolation voltage (for example, see PTL 1). Furthermore, as shown in FIG. 15, a power (signal) transmission apparatus using an open-ring electromagnetic resonance coupler as a wireless signal transmitter has been proposed (for example, see PTL 4),

CITATION LIST

Patent Literature

[PTL 1] Description of U.S. Pat. No. 7,692,444
[PTL 2] Japanese Unexamined Patent Application Publication No. 2001-267905
[PTL 3] Japanese Unexamined Patent Application Publication No. 2007-311753
[PTL 4] Japanese Unexamined Patent Application Publication No. 2008-067012

Non Patent Literature

[NPL 1] Andre Kurs, et al: non-Patent Literature 1 "Wireless Power Transfer via Strongly Coupled Magnetic Resonances, Science Express, Vol. 317, No. 5834, pp 83-86 (2007)"

SUMMARY

Technical Problem

However, when a gate drive circuit having a DC isolation function is realized using an electromagnetic resonance coupler as a wireless power transmission apparatus, there is a problem in that the semiconductor switching device cannot be operated at high speed.

In other words, when the power semiconductor switching device is driven using the gate drive circuit including the electromagnetic resonance coupler, the electromagnetic resonance coupler can supply a gate current to the power semiconductor switching device to turn ON the power semiconductor switching device from OFF, but cannot effectively extract the charges accumulated at the gate of the power semiconductor switching device when the power semiconductor switching device is turned OFF from ON, whereby the power semiconductor switching device cannot be fallen at high speed. This is because the electromagnetic resonance coupler is an element which only transmits power passively, and therefore the electromagnetic resonance coupler can supply power to the load but cannot extract the power actively.

A complementary-type semiconductor switching device including a combination of a P-type transistor and an N-type transistor may be considered as a configuration of a semiconductor switching device driven by a gate drive circuit, to address such a problem. However, when a power semiconductor switching device comprising nitride such as GaN is to be driven, the P-type transistor cannot be fabricated with a nitride semiconductor and the complementary-type configuration cannot be realized.

One or more exemplary embodiments disclosed herein provides a gate drive circuit which has a DC isolation function and is capable of providing a drive signal with not only short rise time but also short fall time to the semiconductor switching device.

Solution to Problem

In one general aspect, the techniques disclosed here feature a gate drive circuit which generates a signal for driving a gate terminal of a semiconductor switching device according to an input binary control signal, the gate drive circuit including: an input port which includes a pair of a signal input port and a ground input port for receiving the control signal; an output port which includes a pair of a signal output port and a ground output port, the ground output port being electrically isolated from the ground input port; a capacitor connected between the signal output port and the ground output port; a modulation unit which includes at least one oscillator circuit and is configured to modulate an oscillation signal output from the oscillator circuit using the control signal input to the input port to generate (i) a first modulated signal indicating timing of a first logical value of the control signal and (ii) a second modulated signal indicating timing of at least a second logical value of the control signal; a first electromagnetic resonance coupler which includes a first transmission-side resonator and a first reception-side resonator coupled by electromagnetic field resonance and is connected to the modulation unit to cause the first modulated signal to be input to the first transmission-side resonator; a second electromagnetic resonance coupler which includes a second transmission-side resonator and a second reception-side resonator coupled by electromagnetic field resonance and is connected to the modulation unit to cause the second modulated signal to be input to the second transmission-side resonator; a first rectifier circuit which includes at least one diode connected to the first reception-side resonator, generates a first demodulated signal by demodulating the first modulated signal, and outputs the first demodulated signal to the output port; and a second rectifier circuit which includes at least one diode connected to the second reception-side resonator, generates a second demodu-lated signal by demodulating the second modulated signal, and outputs the second demodulated signal to the output port.

In addition to the gate drive circuit, a wireless electric power transmission apparatus or an electric DC isolation device can be realized. Furthermore, a switching apparatus including a semiconductor switching device and a gate drive circuit can be realized.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

With the features disclosed herein, a drive signal with not only short rise time but also short fall time can be provided. Furthermore, a gate drive circuit using an electromagnetic resonance coupler in a wireless transmission unit can be realized. Thus, a signal-isolation gate drive circuit can be realized which is miniaturized and does not require an external isolated power supply (realizes lower power consumption).

Specifically, the gate drive circuit according to one or more exemplary embodiments or features disclosed herein can not only isolate the control signals but also directly supply the gate current for switching the power semiconductor switching device.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 1 is a block diagram showing a gate drive circuit according to Embodiment 1.

FIG. 2C is a configuration diagram showing another modification of the first rectifier circuit in the gate drive circuit according to Embodiment 1.

FIG. 3 is a block diagram showing a gate drive circuit including a single oscillator according to the modification of Embodiment 1.

DESCRIPTION OF EMBODIMENTS

Outline of the Present Disclosure

Figure 2A:
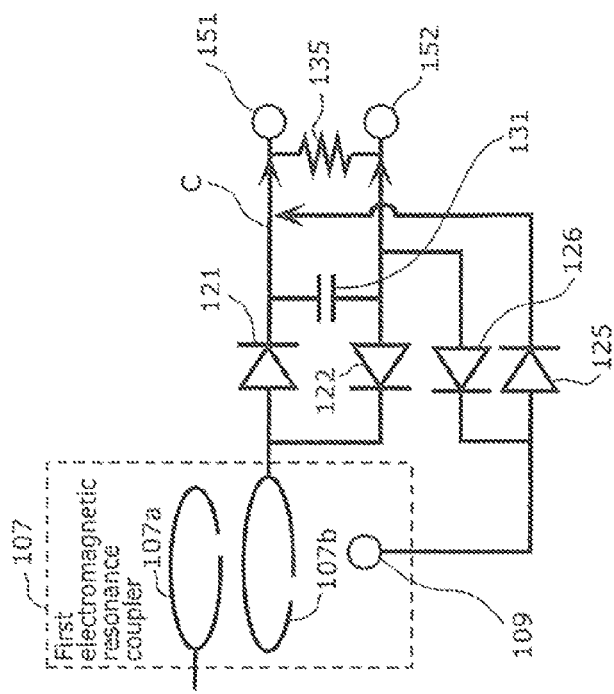
FIG. 2A is a configuration diagram showing a modification of a first rectifier circuit in the gate drive circuit according to Embodiment 1.

In one general aspect, the techniques disclosed here feature a gate drive circuit which generates a signal for driving a gate terminal of a semiconductor switching device according to an input binary control signal, the gate drive circuit including: an input port which includes a pair of a signal input port and a ground input port for receiving the control signal; an output port which includes a pair of a signal output port and a ground output port, the ground output port being electrically isolated from the ground input port; a capacitor connected between the signal output port and the ground output port; a modulation unit which includes at least one oscillator circuit and is configured to modulate an oscillation signal output from the oscillator circuit using the control signal input to the input port to generate (i) a first modulated signal indicating timing of a first logical value of the control signal and) a second modulated signal indicating timing of at least a second logical value of the control signal; a first electromagnetic resonance coupler which includes a first transmission-side resonator and a first reception-side resonator coupled by electromagnetic field resonance and is connected to the modulation unit to cause the first modulated signal to be input to the first transmission-side resonator; a second electromagnetic resonance coupler which includes a second transmission-side resonator and a second reception-side resonator coupled by electromagnetic field resonance and is connected to the modulation unit to cause the second modulated signal to be input to the second transmission-side resonator; a first rectifier circuit which includes at least one diode connected to the first reception-side resonator, generates a first demodulated signal by demodulating the first modulated signal, and outputs the first demodulated signal to the output port; and a second rectifier circuit which includes at least one diode connected to the second reception-side resonator, generates a second demodulated signal by demodulating the second modulated signal, and outputs the second demodulated signal to the output port.

With this, a signal-isolation gate drive circuit using wireless power transmission can be realized. Furthermore, since the two electromagnetic resonance couplers are used for wirelessly transmitting each of the binary values of the input control signal, a gate drive circuit can be realized which is miniaturized, capable of realizing very low power consumption including power for driving the gate, and capable of providing a drive signal with not only short rise time but also short fall time.

For example, the modulation unit may further include a first mixer circuit and a second mixer circuit which are connected to the signal input port, the first mixer circuit may generate the first modulated signal by modulating the oscillation signal output from the oscillator circuit using the control signal input to the input port, and the second mixer circuit may generate the second modulated signal by modulating the oscillation signal output from the oscillator circuit using the control signal input to the input port.

With this, the two mixer circuits generate the two modulated signals. This allows adopting independent and different modulation schemes for the circuits of two systems (circuits each corresponding to one of two states of the input control signal (first logical value; ON state and second logical value; OFF state)), thereby reducing mutual interference.

For example, the modulation unit may further include an inverting circuit connected between the signal input port and the second mixer circuit.

With this, the input control signal is inverted by the inverting circuit and then the second modulated signal is generated. Therefore, even when the first mixer circuit and the second mixer circuit are in the same form, drive signals each corresponding to one of the two states (ON state and OFF state) of the control signal can be output from the gate circuit.

For example, the modulation unit may include, as the at least one oscillator circuit, a first oscillator circuit and a second oscillator circuit, the first mixer circuit may modulate the oscillation signal output from the first oscillator circuit using the control signal, and the second mixer circuit may modulate the oscillation signal output from the second oscillator circuit using the control signal. At this time, the oscillation signal output from the first oscillator circuit may have a frequency different from a frequency of the oscillation signal output from the second oscillator circuit.

With this, the two modulated signals are generated using the oscillation signals from the two independent oscillator circuits. This allows establishing a gate drive circuit including two electromagnetic resonance couplers having different resonant frequencies. Therefore, interference is reduced between a signal when the output is in the ON state and a signal when the output is in the OFF state, and an excellent output waveform can be obtained.

For example, least one of the first mixer circuit and the second mixer circuit may be a switch circuit which turns ON and OFF according to the control signal. At this time, the switch circuit included in the first mixer circuit may be a first transistor which has a gate terminal connected to the signal input port, a drain terminal connected to the oscillator circuit, and a source terminal connected to the ground input port, and outputs a signal at the drain terminal as the first modulated signal, and the switch circuit included in the second mixer circuit may be a second transistor which has a gate terminal connected to the signal input port, a drain terminal connected to the oscillator circuit, and a source terminal, and outputs a signal at the source terminal as the second modulated signal. The switch circuit included in the first mixer circuit may be a first transistor which has a gate terminal connected to the signal input port, a drain terminal connected to the oscillator circuit, and a source terminal, and outputs a signal at the source terminal as the first modulated signal, and the switch circuit included in the second mixer circuit may be a second transistor which has a gate terminal connected to the signal input port, a drain terminal connected to the oscillator circuit, and a source terminal connected to the ground input port, and outputs a signal at the drain terminal as the second modulated signal.

With this, the mixer circuit can be configured with a single transistor, and therefore the circuit of the modulation unit is simplified.

For example, modulation unit may further include a path changing circuit which selects one of two output paths for the oscillation signal output from the oscillator circuit based on the control signal input to the signal input port, and the path changing circuit outputs the oscillation signal for which a first of the two output paths is selected as the first modulated signal and outputs the oscillation signal for which a second of the two output paths is selected as the second modulated signal.

With this, the single switch circuit generates two modulated signals, and therefore the circuit of the modulation unit is simplified.

For example, the modulation unit may further include a first mixer circuit which modulates the oscillation signal output from the oscillator circuit using the control signal input to the signal input port, outputs the modulated signal obtained by the first mixer circuit as the first modulated signal, and outputs the oscillation signal output from the oscillator circuit as the second modulated signal.

With this, the second modulated signal can be generated without requiring the mixer circuit, and therefore the circuit of the modulation unit is simplified.

For example, the gate drive circuit may further include a resistor connected between the signal output port and the ground output port.

With this, the impedance between the signal output port and the ground output port of the gate drive circuit becomes low. Therefore, even when a load connected to the output of the gate drive circuit changes, an output voltage can be stably supplied to the load.

For example, the at least one oscillator circuit may be an oscillator which outputs a differential signal including a first oscillation signal and a second oscillation signal, and the modulation unit may be configured to modulate the first oscillation signal using the control signal to generate the first modulated signal, and modulate the second oscillation signal using the control signal to generate the second modulated signal.

With this, the oscillation signal is output as a differential signal. Therefore, a gate drive circuit can be realized which causes less noise and operates in a stable manner as compared with the case where the oscillation signal is output as a single-end signal.

For example, the gate drive circuit may further include an amplifier circuit which amplifies the first modulated signal, wherein the first electromagnetic resonance coupler may be connected to the modulation unit via the amplifier circuit to cause the first modulated signal amplified by the amplifier circuit to be input to the first transmission-side resonator.

With this, the first modulated signal is amplified and then input to the first electromagnetic resonance coupler. Therefore, a drive signal can be output with a very short rise time and can drive even when the load connected to the output is large.

For example, the first rectifier circuit may include, as the at least one diode, at least one of (i) a first positive rectifier diode having an anode connected to the first reception-side resonator and a cathode connected to the signal output port and (ii) a first negative rectifier diode having an anode connected to the ground output port and a cathode connected to the first reception-side resonator, and the second rectifier circuit may include, as the at least one diode, at least one of (i) a second positive rectifier diode having an anode connected to the second reception-side resonator and a cathode connected to the signal output port and (ii) a second negative rectifier diode having an anode connected to the ground output port and a cathode connected to the second reception-side resonator.

With this, demodulation using the diode is performed which realizes higher demodulation efficiency, and a drive signal with a short rise time and a short fall time is output.

For example, the first rectifier circuit may further include at least one of (i) a third positive rectifier diode having an anode connected to a ground of the first reception-side resonator and a cathode connected to the signal output port, (ii) a third negative rectifier diode having an anode connected to the ground output port and a cathode connected to the ground of the first reception-side resonator, and (iii) a wire which connects the ground of the first reception-side resonator to the signal output port or the ground output port, and the second rectifier circuit may further include at least one of (i) a fourth positive rectifier diode having an anode connected to a ground of the second reception-side resonator and a cathode connected to the signal output port, (ii) a fourth negative rectifier diode having an anode connected to the ground output port and a cathode connected to the ground of the second reception-side resonator, and (iii) a wire which connects the ground of the second reception-side resonator to the signal output port or the ground output port.

With this, the demodulation using the ground of the reception-side resonator is performed which realizes higher demodulation efficiency, and a drive signal with a short rise time and a short fall time is output.

For example, the second rectifier circuit may include: a second positive rectifier diode as the at least one diode, a second capacitor, and a third transistor, the anode of the second positive rectifier diode may be connected to the second reception-side resonator, the cathode of the second positive rectifier diode may be connected to a first end of the second capacitor and a gate terminal of the third transistor, the third transistor may be connected between the signal output port and the ground output port, and a second end of the second capacitor and a source terminal of the third transistor may be connected to the ground output port.

With this, when a signal in the OFF state is output from the output port, the third transistor causes a short circuit between the signal output port and the ground output port via the pull-down resistor or the like. Therefore, a drive signal with a shortened fall time is output.

For example, the first electromagnetic resonance coupler and the second electromagnetic resonance coupler may be open-ring electromagnetic resonance couplers.

With this, a gate drive circuit can be provided which is significantly miniaturized and realizes a higher isolation voltage and lower power consumption.

For example, the output port may output an ON signal for turning ON the semiconductor switching device and an OFF signal for turning OFF the semiconductor switching device, according to the logical value of the control signal, the ON signal may cause a potential at the signal output port to be higher than a potential at the ground output port, and the OFF signal may cause a potential at the signal output port to be lower than a potential at the ground output port. A voltage between the signal output port and the ground output port may become zero immediately before the output port outputs the ON signal.

With this, a gate drive circuit can be realized which outputs a drive signal for turning ON and OFF the semiconductor switching device.

For example, the gate drive circuit may further include the semiconductor switching device, wherein the signal output port may be connected to a gate terminal of the semiconductor switching device, and the ground output port may be connected to a source terminal of the semiconductor switching device.

With this, a gate drive circuit including a semiconductor switching device capable of switching at higher speed can be realized. By integrating the above-described gate drive circuit into a semiconductor of one chip, a much miniaturized switching apparatus can be realized.

For example, the semiconductor switching device may be a nitride semiconductor.

With this, a much miniaturized switching apparatus can be realized which provides higher output, capable of switching at higher speed, and requiring no external semiconductor switching device.

In addition to the gate drive circuit, a wireless electric power transmission apparatus or an electric DC isolation device can be realized. Furthermore, a switching apparatus including a semiconductor switching device and a gate drive circuit can be realized.

Hereinafter, certain exemplary embodiments of the gate drive circuit are described with reference to the accompanying Drawings. It is to be noted that the embodiments described below shows a preferable specific example of the present disclosure. The numerical values, shapes, materials, constituent elements, the arrangement and topology of the constituent elements, signal waveforms, and so on shown in the following exemplary embodiments are mere examples, and thus do not limit the present disclosure. The present disclosure is limited by only Claims. Thus, among the constituent elements in the following exemplary embodiments, constituent elements not recited in any of the independent claims indicating the most generic concept of the present disclosure are not always required to achieve the aim of the present disclosure, but are described as preferable constituent elements.

Embodiment 1

First, Embodiment 1 of the gate drive circuit is described.

FIG. 1 is a block diagram showing a gate drive circuit 101 including a wireless signal transmission mechanism using an electromagnetic resonance coupler, according to Embodiment 1.

The gate drive circuit 101 is a circuit which generates a signal for driving a gate terminal of a semiconductor switching device (here, a power semiconductor switching device 161 comprising GaN) according to an input binary control signal (hereinafter also referred to as "input signal"), and includes: (1) an input port which includes a pair of a signal input port 141 and a ground input port 142 for receiving the control signal; (2) an output port which includes a pair of a signal output port 151 and a ground output port 152, the ground output port 152 being electrically isolated from the ground input port 142; (3) a capacitor (a first capacitor 131 and a second capacitor 132) connected between the signal output port 151 and the ground output port 152; (4) a modulation unit 170 which includes at least one oscillator circuit (here, a first oscillator circuit 102 and a second oscillator circuit 103) and modulates an oscillation signal output from the oscillator circuit using the control signal input to the input port to generate (i) a first modulated signal indicating timing of a first logical value of the control signal and (ii) a second modulated signal indicating timing of at least a second logical value of the control signal; (5) a first electromagnetic resonance coupler 107 which includes a first transmission-side resonator 107a and a first reception-side resonator 107b coupled by electromagnetic field resonance and is connected to the modulation unit 170 to cause the first modulated signal to be input to the first transmission-side resonator 107a; (6) a second electromagnetic resonance coupler 108 which includes a second transmission-side resonator 108a and a second reception-side resonator 108b coupled by electromagnetic field resonance and is connected to the modulation unit 170 to cause the second modulated signal to be input to the second transmission-side resonator 108a; (7) a first rectifier circuit 171 which includes at least one diode (here, a first positive rectifier diode 121 and a first negative rectifier diode 122) connected to the first reception-side resonator 107b, generates a first demodulated signal by demodulating the first modulated signal, and outputs the first demodulated signal to the output port; (8) a second rectifier circuit 172 which includes at least one diode (here, a second positive rectifier diode 123 and a second negative rectifier diode 124) connected to the second reception-side resonator 108b, generates a second demodulated signal by demodulating the second modulated signal, and outputs the second demodulated signal to the output port; and (9) a pull-down resistor 135 connected between a signal output port 151 and a ground output port 152). Here, the signal output port 151 is connected to the gate terminal of the power semiconductor switching device 161, and the ground output port 152 is connected to the source terminal of the power semiconductor switching device 161.

It is to be noted that the positive rectifier diode is a diode which is connected to rectify the input signal in a direction that the current flows from the gate drive circuit 101 to the power semiconductor switching device 161. The negative rectifier diode is a diode which is connected to rectify the input signal in a direction that the current flows from the power semiconductor switching device 161 to the gate drive circuit 101.

In the present embodiment, the modulation unit 170 further includes a first mixer circuit 104 and a second mixer circuit 105 connected to the signal input port 141. The first mixer circuit 104 generates a first modulated signal by modulating the oscillation signal output from the first oscillator circuit 102 using the control signal input to the input port. In contrast, the second mixer circuit 105 generates a second modulated signal by modulating the oscillation signal output from the second oscillator circuit 103 using the control signal input to the input port.

The gate drive circuit 101 outputs, from the output port, an ON signal for turning ON the power semiconductor switching device 161 and an OFF signal for turning OFF the power semiconductor switching device 161, according to the logical values of the input control signal (first logical value; ON state (here, High) and second logical value; OFF state (here, Low). Here, the ON signal causes a potential at the signal output port 151 to be higher than a potential at the ground output port 152. In contrast, the OFF signal causes a potential at the signal output port 151 to be lower than a potential at the ground output port 152. A voltage between the signal output port 151 and the ground output port 152 becomes zero immediately before the output port outputs the ON signal.

It is to be noted that the gate drive circuit 101 may be implemented as a single-chip integrated circuit by itself or together with the power semiconductor switching device 161.

Further details are described on the configuration of the gate drive circuit 101.

The gate drive circuit 101 according to Embodiment 1 includes: a first oscillator circuit 102, a second oscillator circuit 103, a first mixer circuit 104, a second mixer circuit 105, an inverting circuit 106, a first electromagnetic resonance coupler 107, a second electromagnetic resonance coupler 108, a first rectifier circuit 171, a second rectifier circuit 172, a first capacitor 131, a second capacitor 132, and a pull-down resistor 135. The first rectifier circuit 171 includes a first positive rectifier diode 121 and a first negative rectifier diode 122. The second rectifier circuit 172 includes a second positive rectifier diode 123 and a second negative rectifier diode 124. In the gate drive circuit 101 according to Embodiment 1, a control signal (hereinafter also called an "input signal") such as a pulse width modulation (PWM) is input from the signal input port 141 by referring to the ground input port 142, and a power semiconductor switching device 161 is connected to the output port. The signal output port 151 and the ground output port 152 in the Drawing are included in the output port. The signal output port 151 is connected to the gate terminal of the power semiconductor switching device 161. The ground output port 152 is connected to the source terminal of the power semiconductor switching device 161.

The gate drive circuit 101 is a signal transmission circuit which has a DC isolation function in which a voltage is generated at the gate of the power semiconductor switching device 161 according to the input signal and ON/OFF of the power semiconductor switching device 161 is controlled.

The signal input port 141 of the gate drive circuit 101 is connected to the first mixer circuit 104, and to the second mixer circuit 105 via the inverting circuit 106. Here, the mixer circuit is an arithmetic circuit which outputs a signal having a frequency that is a sum or difference of frequencies of the two input signals. Examples of the mixer circuit includes: a double balanced mixer, a single-ended diode mixer, a double balanced diode mixer, a guilbert cell mixer, and other active mixers. Here, the mixer may be a differential mixer. For example, the first mixer circuit 104 and the second mixer circuit 105 may be replaced by a single differential-input and differential-output differential mixer. The inverting circuit 106 is also called an inverter (NOT) circuit, and has a function to invert the polarity (or logical value) of the input signal.

The output of the first oscillator circuit 102 is connected to the input of the first mixer circuit 104. The output of the second oscillator circuit 103 is connected to the input of the second mixer circuit 105. Here, the oscillator circuit is a circuit which generates and outputs a continuous AC signal having a specific frequency (that is, an oscillation signal).

Although the first oscillator circuit 102 and the second oscillator circuit 103 are single-ended output oscillator circuits, these may be differential output oscillator circuits. Specifically, these may be an oscillator which outputs a differential signal including a first oscillation signal and a second oscillation signal. With the differential-output oscillator circuits, the output two oscillation signals have different (inverted) phases, thereby reducing interference between signals in the two paths through which the two oscillation signals are transmitted. Therefore, an excellent output waveform can be obtained from the mixer circuit.

Here, the first oscillator circuit 102 and the second oscillator circuit 103 have oscillation frequencies higher than a frequency of the input signal. For example, the PWM signal that is the input signal has a carrier frequency of approximately 10 kHz in general, and the pulse waveform of approximately 1 MHz. In contrast, the first oscillator circuit 102 and the second oscillator circuit 103 have oscillation frequency of 5.8 GHz. It is to be noted that the first oscillator circuit 102 and the second oscillator circuit 103 may have oscillation frequencies different from each other. Using the different oscillation frequency can reduce the cross talk of the signals. Therefore, an excellent output waveform can be obtained from the mixer circuit. At this time, the oscillation frequencies of the first oscillator circuit 102 and the second oscillator circuit 103 are not limited to 5.8 GHz, but a beneficial oscillation frequency for sufficiently modulating the input signal is 100 MHz or more that is a high-frequency.

The oscillation frequency of the first oscillator circuit 102 is designed to suit a transmission frequency (operation frequency or resonant frequency) of the first electromagnetic resonance coupler 107, and the oscillation frequency of the second oscillator circuit 103 is designed to suit a transmission frequency of the second electromagnetic resonance coupler 108, in the same manner.

Figure 15:
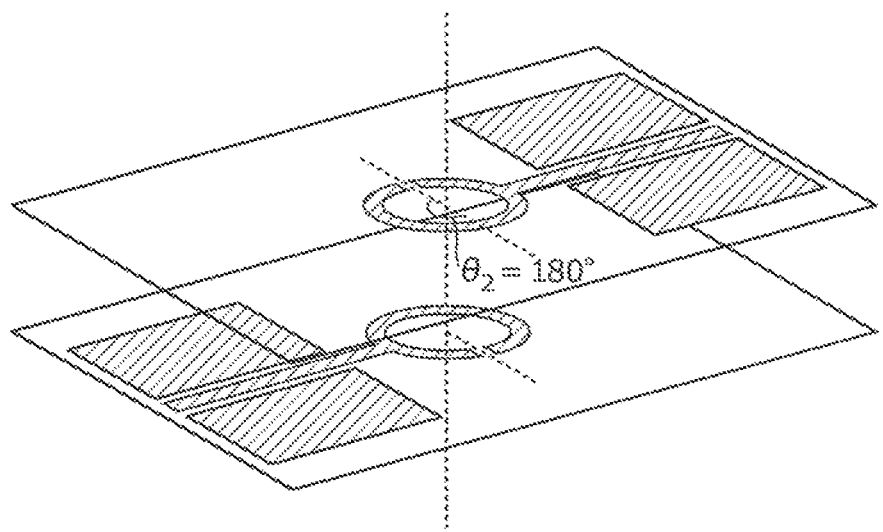
FIG. 15 shows a schematic view of a conventional electromagnetic resonance coupler.

The output of the first mixer circuit 104 is connected to the first transmission-side resonator 107a, and the output of the second mixer circuit 105 is connected to the second transmission-side resonator 108a. The first electromagnetic resonance coupler 107 and the second electromagnetic resonance coupler 108 are each an open-ring electromagnetic resonance coupler as shown in FIG. 15, and are designed to be able to wirelessly transmit a signal having a frequency of 5.8 GHz from the transmission-side resonator to the reception-side resonator of the electromagnetic resonance coupler. Using such an open-ring electromagnetic resonance coupler significantly miniaturizes the electromagnetic resonance coupler and allows integrating the electromagnetic resonance coupler into a semiconductor chip. Although the first electromagnetic resonance coupler 107 and the second electromagnetic resonance coupler 108 are described as open-ring electromagnetic resonance couplers as shown in FIG. 15, the electromagnetic resonance couplers may be in other shapes (closed-ring, spiral, etc.).

The first reception-side resonator 107b is connected to the first rectifier circuit 171 including two diodes. The anode of the first positive rectifier diode 121 is connected to the first reception-side resonator 107b, and the cathode is connected to the signal output port 151 of the gate drive circuit 101. The cathode of the first negative rectifier diode 122 is connected to the first reception-side resonator 107b, and the anode is connected to the ground output port 152 of the gate drive circuit 101.

In contrast, the second reception-side resonator 108b is connected to the second rectifier circuit 172 including two diodes. The anode of the second positive rectifier diode 123 is connected to the second reception-side resonator 108b, and the cathode is connected to the ground output port 152 of the gate drive circuit 101. The cathode of the second negative rectifier diode 124 is connected to the second reception-side resonator 108b, and the anode is connected to the signal output port 151 of the gate drive circuit 101.

In Embodiment 1, the first negative rectifier diode 122 and the second positive rectifier diode 123 are not necessary.

Furthermore, the first capacitor 131, the second capacitor 132, and the pull-down resistor 135 are connected in parallel, between the signal output port 151 and the ground output port 152. Although the first capacitor 131 and the second capacitor 132 are separate capacitors independent from each other, a single capacitor in which those two capacitors are integrated into one may be used instead.

The pull-down resistor 135 plays a role to stabilize impedance at the output side of the rectifier circuit (first rectifier circuit 171 and second rectifier circuit 172), even when various load (a changing load) is connected to the output port of the gate drive circuit 101. Thus, an excellent output signal can be obtained at the output port. However, the gate drive circuit 101 can operate without the pull-down resistor 135.

Furthermore, the inductance and the capacitance (LC component) of the first electromagnetic resonance coupler 107 and the second electromagnetic resonance coupler 108 may be implemented by the inductance and the capacitance (LC component) of the first oscillator circuit 102 or the second oscillator circuit 103, instead of the independent elements (first electromagnetic resonance coupler 107 and second electromagnetic resonance coupler 108) as in the present embodiment.

Furthermore, the ground of the first reception-side resonator 107b may be connected to the ground output port 152. Likewise, the ground of the second reception-side resonator 108b may be connected to the ground output port 152.

Furthermore, a coupling capacitor, which realizes capacitive coupling to cut a direct-current component of a signal, may be connected between the first oscillator circuit 102 and the first mixer circuit 104 or between the second oscillator circuit 103 and the second mixer circuit 105. Likewise, the coupling capacitor, which realizes capacitive coupling to cut a direct-current component of a signal, may be connected between the first mixer circuit 104 and the first electromagnetic resonance coupler 107 or between the second mixer circuit 105 and the second electromagnetic resonance coupler 108. Furthermore, the coupling capacitor, which realizes capacitive coupling to cut a direct-current component of a signal, may be connected between the first electromagnetic resonance coupler 107 and the first rectifier circuit 171 or between the second electromagnetic resonance coupler 108 and the second rectifier circuit 172.

Next, an operation performed by the gate drive circuit 101 configured as above according to Embodiment 1 is described with reference to the signal waveform shown in FIG. 1.

FIG. 1 shows a waveform of an input signal, a waveform of a first modulated signal at Point A, a waveform of a second modulated signal at Point B, a waveform of a first demodulated signal at Point C in the case where no signal passes through the second electromagnetic resonance coupler 108, a waveform of a second demodulated signal at Point D in the case where no signal passes through the first electromagnetic resonance coupler 107, and a waveform of an output signal between the signal output port 151 and the ground output port 152. Each waveform is a voltage waveform with respect to the elapsed time. The output waveform is a voltage waveform in which the signal output port 151 is plus with respect to the voltage at the ground output port 152.

When an input signal such as a PWM signal is input to the signal input port 141 of the gate drive circuit 101, the input signal is input to the first mixer circuit 104, and to the second mixer circuit 105 via the inverting circuit 106. When the input signal is input to the first mixer circuit 104, the first mixer circuit 104 mixes the input signal and the oscillation signal from the first oscillator circuit 102. Specifically, when the input signal is input, a signal having an oscillation frequency of the first oscillator circuit 102 is output, as a modulated signal, from the first mixer circuit 104. The waveform of the output from the first mixer circuit 104 (first modulated signal at Point A) is shown in FIG. 1. The input signal is input to the second mixer circuit 105 via the inverting circuit 106 at the same time as the above, and the modulated signal, which is obtained by modulating the oscillation signal having the oscillation frequency of the second oscillator circuit 103 using the input signal, is output from the second mixer circuit 105 (output as the second modulated signal at Point B), in the same manner. At this time, since the input signal has passed through the inverting circuit 106, a signal having an inverted waveform of the input signal is input to the second mixer circuit 105. Thus, the waveform of the first modulated signal output from the first mixer circuit 104 has an inverted waveform (has a phase different by 180 degrees) of the second modulated signal output from the second mixer circuit 105. As it can be understood from the relationship between the waveform of the first modulated signal at Point A and the waveform of the second modulated signal at Point B in FIG. 1, when the first modulated signal is output from the first mixer circuit 104, the second mixer circuit 105 does not output the second modulated signal. Here, it is also possible to make the second mixer circuit 105 have a function to invert the waveform. In this case, the inverting circuit 106 is not required. Furthermore, the first mixer circuit 104 functions as a control switch circuit for the output from the first oscillator circuit 102, and the second mixer circuit 105 functions as a control switch circuit for the output from the second oscillator circuit 103. The first mixer circuit 104 and the second mixer circuit 105 may be implemented as a switching circuit.

Next, the first modulated signal output from the first mixer circuit 104 is input to the first electromagnetic resonance coupler 107. As described above, the input signal input to the input port has been converted to a modulated signal (first modulated signal) having a high frequency of 5.8 GHz, whereby the modulated signal is propagated wirelessly via the first electromagnetic resonance coupler 107 that operates with a high operation frequency. Therefore, the first modulated signal is output to the first reception-side resonator 107b with high transmission efficiency due to the electromagnetic resonance coupling. As described above, in Embodiment 1, the electromagnetic resonance coupler is used and the transmission-side resonator and the reception-side resonator are strongly coupled, thereby significantly reducing the noise emitted to the outside and the effect by the noise. Therefore, an excellent output waveform can be obtained.

The first modulated signal output from the first electromagnetic resonance coupler 107 is input to the first rectifier circuit 171, and the signal having a high frequency of 5.8 GHz is rectified by the first capacitor 131 connected subsequently. In this step, the envelope detection is performed on the first modulated signal, and therefore the high-frequency component is removed and the first modulated signal is demodulated into the original input signal (low-frequency waveform). The waveform of the first demodulated signal, at Point C, rectified by the first rectifier circuit 171 is shown in FIG. 1. At this time, the cathode of the first positive rectifier diode 121 is connected to the signal output port 151, and the anode of the first negative rectifier diode 122 is connected to the ground output port 152. Thus, when the input signal is in the ON state (that is when the input signal is the first logical value; here, High) a voltage is generated which becomes, at the signal output port 151, positive with respect to the voltage of the ground output port 152.

As described above, the input and output of the gate drive circuit 101 are insulated by the first electromagnetic resonance coupler 107, whereby the voltage at the ground output port 152 is floating. Even in this case, a voltage can be supplied between the signal output port 151 and the ground output port 152. However, if the gate drive circuit is configured only with a circuit which transmits the ON state of the input signal (a first path), a gate voltage can be supplied to the power semiconductor switching device 161 connected to the output port of the gate drive circuit, but the supplied gate current cannot be extracted when the input signal is turned OFF (when the input signal is the second logical value; here, Low). Therefore, in Embodiment 1, a second path including: the second oscillator circuit 103, the second mixer circuit 105; the second electromagnetic resonance coupler 108; and the second rectifier circuit 172; is provided to supply electric power having a voltage which becomes negative between the signal output port 151 and the ground output port 152 when the input signal is in the OFF state.

The second modulated signal output from the second mixer circuit 105 is wirelessly transmitted to the second rectifier circuit 172 via the second electromagnetic resonance coupler 108. The second modulated signal output from the second electromagnetic resonance coupler 108 is input to the second rectifier circuit 172, and the signal having a high frequency of 5.8 GHz is rectified by the second capacitor 132 connected subsequently. In this step, the envelope detection is performed on the second modulated signal, and therefore the high-frequency component is removed and the second modulated signal is demodulated into the original input signal (low-frequency waveform).

The waveform of the second demodulated signal, at Point D, rectified by the second rectifier circuit 172 is shown in FIG. 1. Here, unlike the first rectifier circuit 171, the cathode of the second positive rectifier diode 123 is connected to the ground output port 152 and the anode of the second negative rectifier diode 124 is connected to the signal output port 151. Thus, when the input signal is in the OFF state, a voltage is generated which becomes, at the ground output port 152, positive with respect to the voltage at the signal output port 151. Specifically, when the input signal is in the OFF state, a negative voltage is applied to the gate terminal of the power semiconductor switching device 161 connected to the output port. Therefore, the charges accumulated in the gate of the semiconductor switching device 161 can be extracted when the input signal is turned OFF from ON, which realizes a switching operation in very short turn-off time.

Although the first rectifier circuit 171 of the gate drive circuit 101 according to Embodiment 1 is configured with the first positive rectifier diode 121 and the first negative rectifier diode 122 in FIG. 1, the first rectifier circuit 171 may be configured as shown in FIG. 2A to FIG. 2F. The rectifier circuits according to these modifications can be applied as rectifier circuits in other embodiments described below.

The rectifier circuit shown in FIG. 2A is a full-wave rectifier circuit. The output of the first reception-side resonator 107b is connected to the anode of the first positive rectifier diode 121 and the cathode of the first negative rectifier diode 122. The cathode of the first positive rectifier diode 121 is connected to the signal output port 151, and the anode of the first negative rectifier diode 122 is connected to the ground output port 152. Furthermore, the ground 109 of the first reception-side resonator 107b is connected to the anode of the third positive rectifier diode 125 and the cathode of the third negative rectifier diode 126. The cathode of the third positive rectifier diode 125 is connected to the signal output port 151, and the anode of the third negative rectifier diode 126 is connected to the ground output port 152. The above configuration improves the rectification efficiency.

Figure 2B:
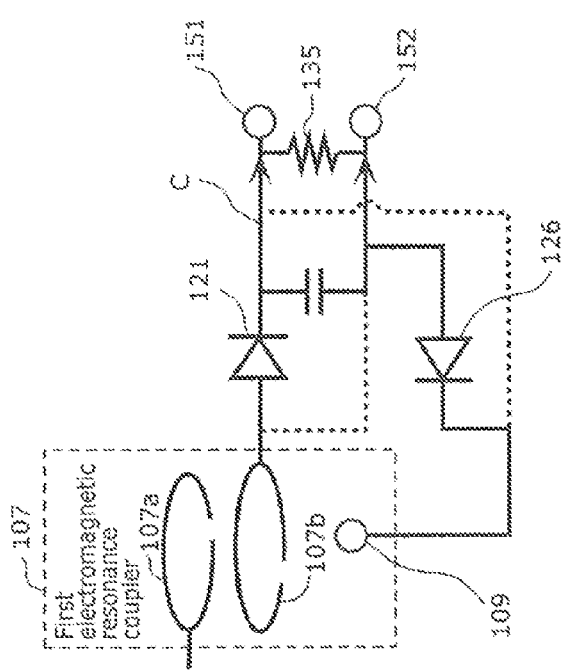
FIG. 2B is a configuration diagram showing another modification of the first rectifier circuit in the gate drive circuit according to Embodiment 1.
Figure 2D:
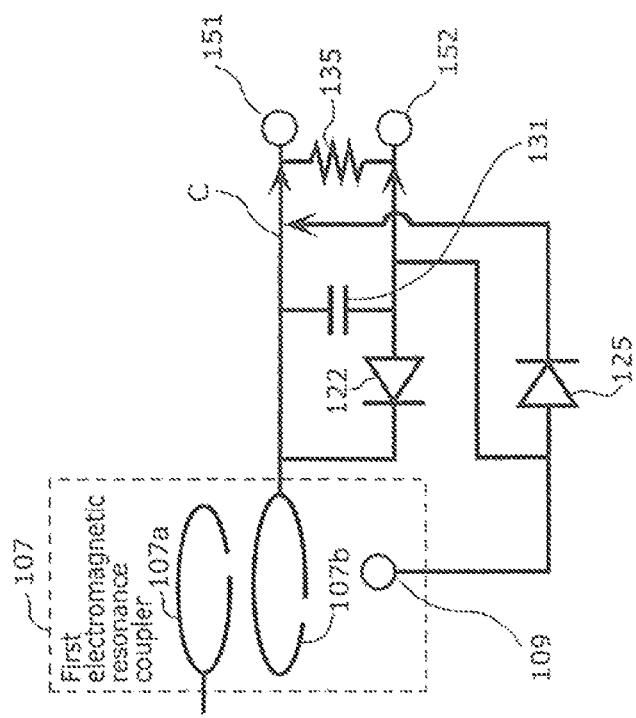
FIG. 2D is a configuration diagram showing another modification of the first rectifier circuit in the gate drive circuit according to Embodiment 1.

The rectifier circuit shown in FIG. 2B is based on the rectifier circuit in FIG. 2A, but does not include the first negative rectifier diode 122 and the third positive rectifier diode 125. Specifically, this rectifier circuit includes the first positive rectifier diode 121 and the third negative rectifier diode 126. Another possible configuration is based on the rectifier circuit in FIG. 2A but does not include the first positive rectifier diode 121 and the third negative rectifier diode 126 as shown in FIG. 2D, which is opposite to the above configuration.

Figure 2E:
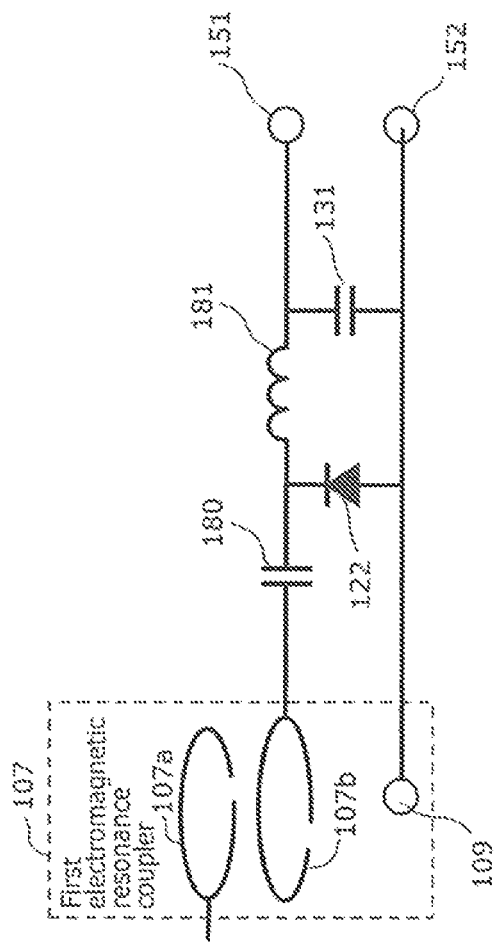
FIG. 2E is a configuration diagram showing another modification of the first rectifier circuit in the gate drive circuit according to Embodiment 1.

The rectifier circuit shown in FIG. 2C is based on the constituent elements of the rectifier circuit in FIG. 2A, but does not include the first negative rectifier diode 122 and the third negative rectifier diode 126 and both ends of the third rectifier diode 125 are shorted. Another possible configuration is based on the first rectifier circuit in FIG. 2A but does not include the first negative rectifier diode 122 and the third positive rectifier diode 125 and both ends of the third rectifier diode 125 are shorted, as shown in FIG. 2E.

Figure 2F:
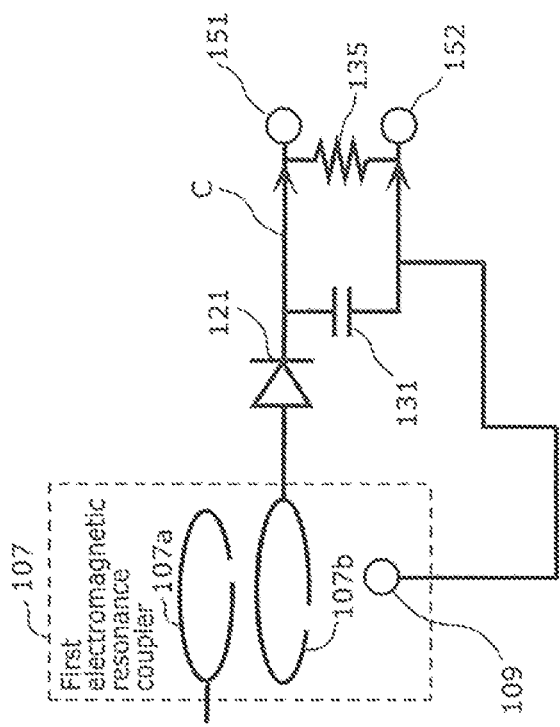
FIG. 2F is a configuration diagram showing another modification of the first rectifier circuit in the gate drive circuit according to Embodiment 1.

In the rectifier circuit shown in FIG. 2F, the output of the first reception-side resonator 107b is connected to a first end of the third capacitor 180. A second end of the third capacitor 180 is connected to the cathode of the first negative rectifier diode 122 and a first end of the first inductor 181. The first inductor 181 has inductance corresponding to a length that is one fourth of the wavelength of the first modulated signal output from the first reception-side resonator 107b. A second end of the first inductor 181 is connected to the signal output port 151 and a first end of the first capacitor 131. The ground 109 of the first reception-side resonator 107b is connected to the anode of the first negative rectifier diode 122, a second end of the first capacitor 131, and the ground output port 152. The above configuration also improves the rectification efficiency.

It is to be noted that the rectifier circuits shown in FIG. 2A to FIG. 2F are not only alternative circuits for the first rectifier circuit 171 but also alternative circuits for the second rectifier circuit 172. Furthermore, the first rectifier circuit 171 and the second rectifier circuit 172 do not necessarily have the same circuit configuration.

As described above, the gate drive circuit 101 according to Embodiment 1 is provided with a second-system circuit including the second electromagnetic resonance coupler 108 which wirelessly transmits the OFF state of the input signal, in addition to the first-system circuit including the first electromagnetic resonance coupler 107 which wirelessly transmits the ON state of the input signal. Therefore, a drive signal with not only a short rise time but also a short fall time can be output. Thus, a gate drive circuit including an electromagnetic resonance coupler as the wireless transmission unit, that is a signal-isolation gate drive circuit which is miniaturized and does not require an external isolated power supply (realizes lower power consumption), can be realized.

Next, a configuration and a function of a gate drive circuit 301 according to a modification of Embodiment 1, that is based on the gate drive circuit 101 according to Embodiment 1 but realized with lower component count, is described with reference to FIG. 3 and FIG. 4.

The gate drive circuit 301 shown in FIG. 3 includes only a first oscillator circuit 302 as the oscillator circuit, by integrating the first oscillator circuit 102 and the second oscillator circuit 103 of the gate drive circuit 101 according to Embodiment 1. Specifically, the gate drive circuit 301 is a circuit which generates a signal for driving a gate terminal of a power semiconductor switching device 361 according to an input binary control signal, and includes an input port (a signal input port 341 and a around input port 342), an inverting circuit 306, a modulation unit 370 (a first oscillator circuit 302, a first mixer circuit 304, and a second mixer circuit 305), a first electromagnetic resonance coupler 307 (a first transmission-side resonator 307a and a first reception-side resonator 307b), a second electromagnetic resonance coupler 308 (a second transmission-side resonator 308a and a second reception-side resonator 308b), a first rectifier circuit 371 (a first positive rectifier diode 321 and a first negative rectifier diode 322), a second rectifier circuit 372 (a second positive rectifier diode 323 and a second negative rectifier diode 324), a capacitor (a first capacitor 331 and a second capacitor 332), a pull-down resistor 335, and an output port (a signal output port 351 and a ground output port 352).

It is to be noted that the constituent elements having the same names as in Embodiment 1 have the same functions as those in Embodiment 1. The above is applied to the description below. Accordingly, description on the constituent elements having the same names is omitted.

With the above configuration, the gate drive circuit 301 in FIG. 3 can be realized with lower component count while operating in the same manner as the gate drive circuit 101 according to the above Embodiment 1. With this configuration, a common oscillation frequency is used in the circuits of two systems, which allows designing other constituent elements using the same circuit and fabricating the gate drive circuit 301 easier. Furthermore, by using a differential-output oscillator circuit as the first oscillator circuit 302, generating the first modulated signal using the oscillation signal which is a first of the differential output, and generating a second modulated signal using the oscillation signal which is a second of the differential output, the interference is reduced between the two paths and an excellent operation can be realized. The two paths includes: the path which passes through the first electromagnetic resonance coupler 307 and the path which passes through the second electromagnetic resonance coupler 308.

Figure 4:
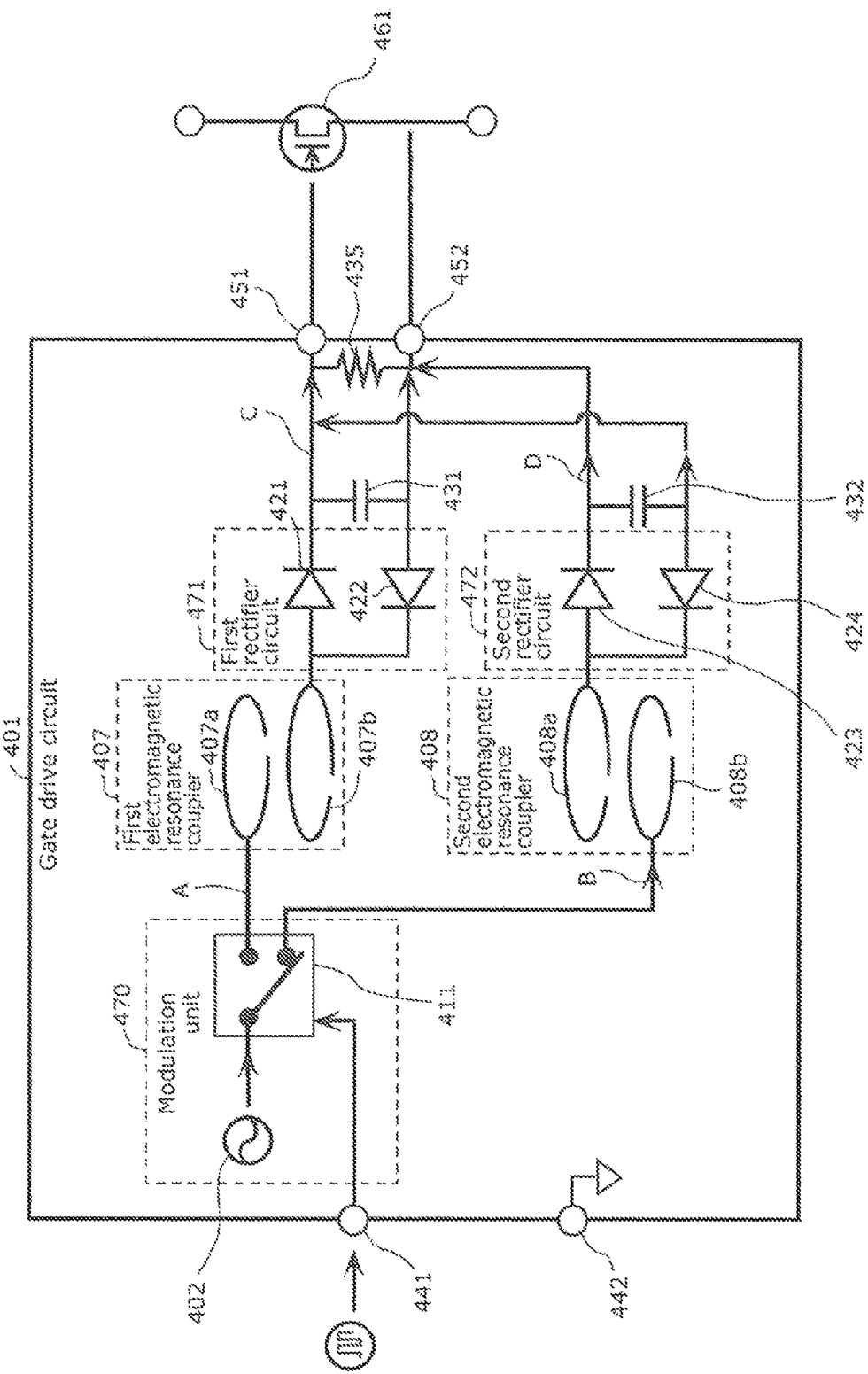
FIG. 4 is a block diagram showing a gate drive circuit including a path changer according to the modification of Embodiment 1.

Furthermore, with the configuration shown in FIG. 4, the gate drive circuit can be realized with lower component count. A gate drive circuit 401 shown in FIG. 4 is based on the gate drive circuit 101 according to Embodiment 1, but does not include: the second oscillator circuit 103; the first mixer circuit 104; the second mixer circuit 105; and the inverting circuit 106, and includes a path changing circuit 411. Specifically, the gate drive circuit 401 is a circuit which generates a signal for driving a gate terminal of a power semiconductor switching device 461 according to an input binary control signal, and includes an input port (a signal input port 441 and a ground input port 442), a modulation unit 470 (a first oscillator circuit 402 and a path changing circuit 411), a first electromagnetic resonance coupler 407 (a first transmission-side resonator 407a and a first reception-side resonator 407b), a second electromagnetic resonance coupler 408 (a second transmission-side resonator 408a and a second reception-side resonator 408b), a first rectifier circuit 471 (a first positive rectifier diode 421 and a first negative rectifier diode 422), a second rectifier circuit 472 (a second positive rectifier diode 423 and a second negative rectifier diode 424), a capacitor (a first capacitor 431 and a second capacitor 432), a pull-down resistor 435, and an output port (a signal output port 451 and a ground output port 452).

The output of the first oscillator circuit 402 is connected to the input of the path changing circuit 411. The path changing circuit 411 includes two output paths each connected to one of the first electromagnetic resonance coupler 407 and the second electromagnetic resonance coupler 408. The input signal, such as PWM, input to the signal input port 441 of the gate drive circuit 401 is input to the control terminal of the path changing circuit 411. Here, the path changing circuit 411 is a circuit which changes the wiring path according to the input of the signal to the control terminal of the path changing circuit 411, and is called a single pole double throw (SPDT) switch. Specifically, the path changing circuit 411 selects one of two output paths for the oscillation signal output from the first oscillator circuit 402 based on the input signal input to the signal input port 441. Such a path changing circuit 411 is a changing circuit for high-frequency signals, and can be realized by a circuit in which a capacity or inductance of the wire is changed to an open state at a specific frequency, and an radio frequency microelectromechanical system (RF-MEMS), for example.

Here, in the case where the input signal is input to the control terminal of the path changing circuit 411 (ON state), the oscillation signal from the first oscillator circuit 402 is output to the first electromagnetic resonance coupler 407 but not to the second electromagnetic resonance coupler 408. In contrast, in the case where the input signal is not input to the control terminal of the path changing circuit 411 (OFF state), the oscillation signal from the first oscillator circuit 402 is not output to the first electromagnetic resonance coupler 407 but output to the second electromagnetic resonance coupler 408. With the above configuration, the gate drive circuit 401 according to the modification can operate in the same manner as the gate drive circuit 101 according to Embodiment 1 without the mixer circuit and two oscillator circuits.

Figure 5:
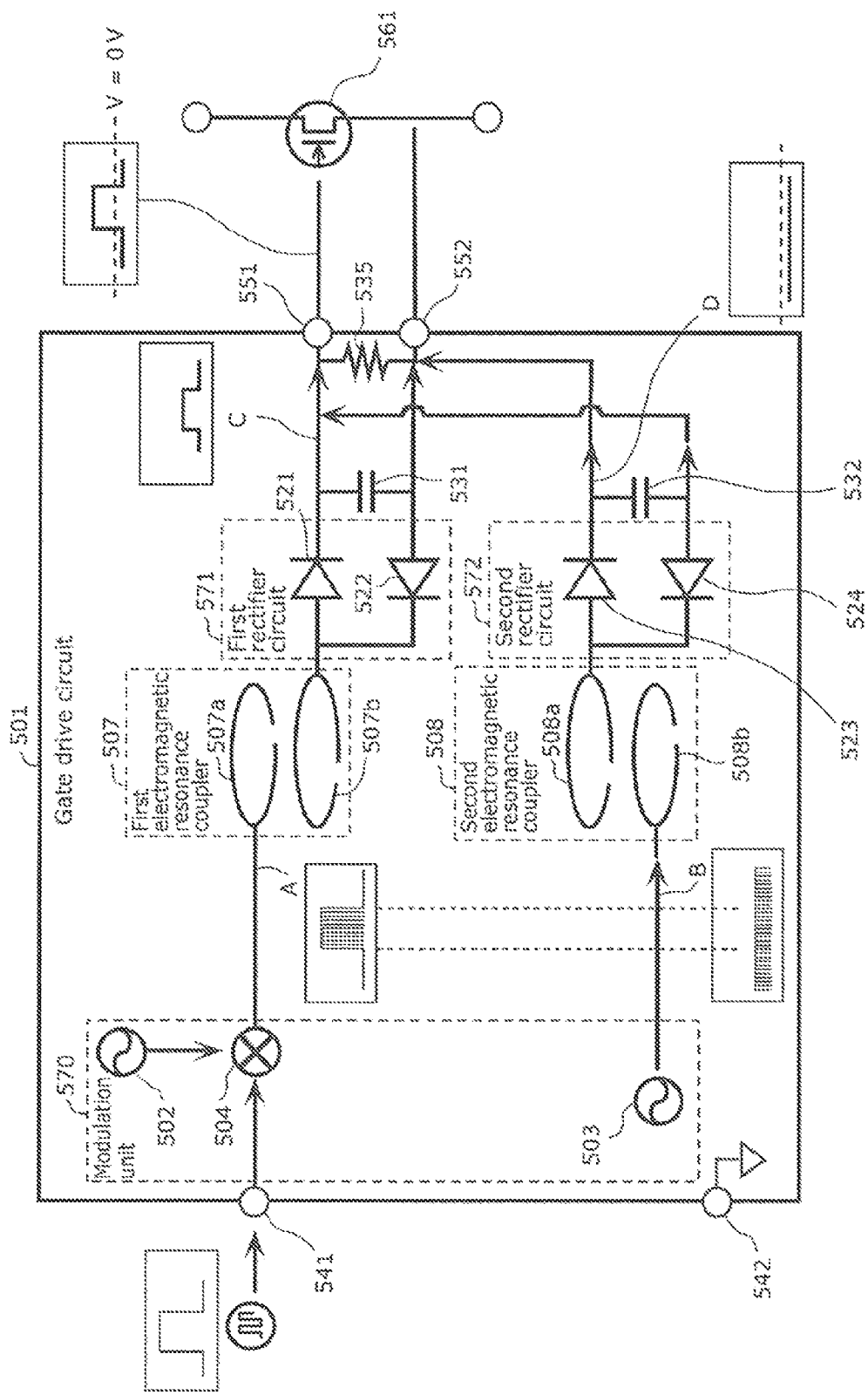
FIG. 5 is a block diagram showing a constant-negative-output gate drive circuit according to the modification of Embodiment 1.

Furthermore, as the gate drive circuit realized with lower component count, a gate drive circuit 501 configured as shown in FIG. 5 can be raised. The gate drive circuit 501 shown in FIG. 5 is based on the gate drive circuit 101 according to Embodiment 1 shown in FIG. 1, but does not include the second mixer circuit 105. Specifically, the gate drive circuit 501 is a circuit which generates a signal for driving a gate terminal of a power semiconductor switching device 561 according to an input binary control signal, and includes an input port (a signal input port 541 and a ground input port 542), a modulation unit 570 (a first oscillator circuit 502, a second oscillator circuit 503, and a first mixer circuit 504), a first electromagnetic resonance coupler 507 (a first transmission-side resonator 507a and a first reception-side resonator 507b), a second electromagnetic resonance coupler 508 (a second transmission-side resonator 508a and a second reception-side resonator 508b), a first rectifier circuit 571 (a first positive rectifier diode 521 and a first negative rectifier diode 522), a second rectifier circuit 572 (a second positive rectifier diode 523 and a second negative rectifier diode 524), a capacitor (a first capacitor 531 and a second capacitor 532), a pull-down resistor 535, and an output port (a signal output port 551 and a ground output port 552).

In the above gate drive circuit 501, the input signal input to the signal input port 541 of the gate drive circuit 501 is input only to the first mixer circuit 504. The second oscillator circuit 503 is directly connected to the second electromagnetic resonance coupler 508. Specifically, the oscillation signal output from the second oscillator circuit 503 is directly input to the second electromagnetic resonance coupler 508, without being modulated as the waveform of the modulated signal at Point B in FIG. 5. Therefore, a negative voltage is constantly supplied between the signal output port 551 and the ground output port 552 by the signal which has passed through the second electromagnetic resonance coupler 508. Since the negative output voltage is constantly supplied to the output port, the negative voltage is summed with the voltage generated by going through the first electromagnetic resonance coupler 507 (that is, superimposed), and an output waveform as shown in FIG. 5 is generated. Accordingly, when the output of the gate drive circuit 501 is changed to the OFF state from ON state, the voltage at the gate terminal of the power semiconductor switching device 561 can be negative. Specifically, the fall time of the output signal of the gate drive circuit 501 can be shortened. It is to be noted that the second oscillator circuit 503 may be omitted and the oscillation signal from the first oscillator circuit 502 may be input to the second electromagnetic resonance coupler 508.

Figure 6:
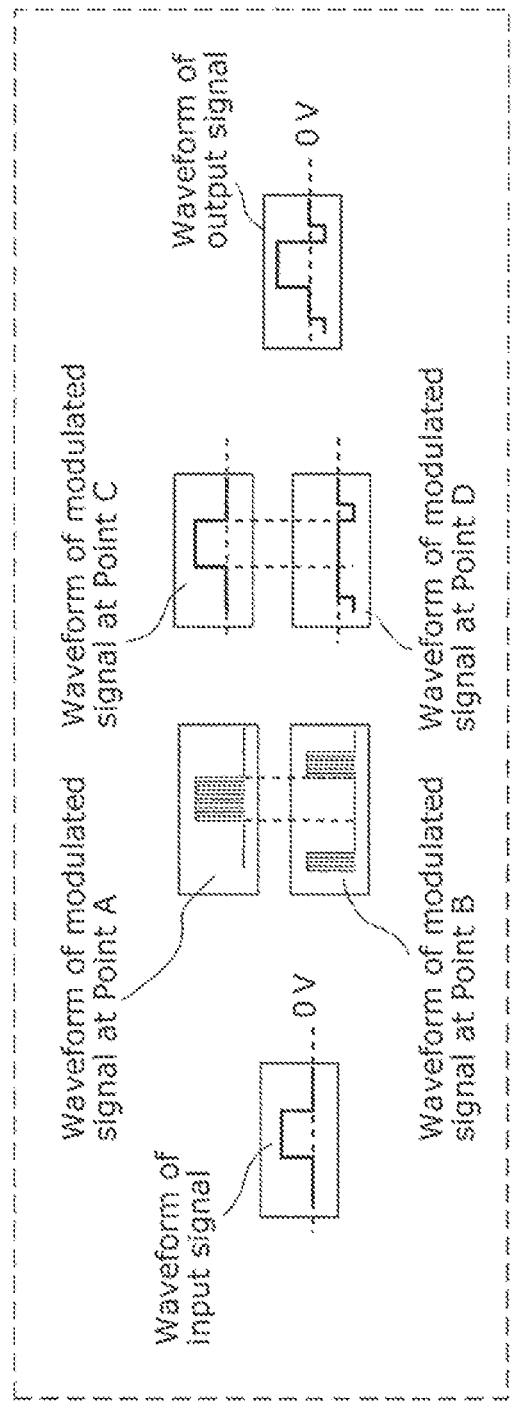
FIG. 6 is a timing chart of a signal waveform at each point in a gate drive circuit according to the modification of Embodiment 1.

In the operation of the gate drive circuit 101 according to Embodiment 1, the relationship (timing) between the waveforms in each path and at each point are described using: the waveform of the input signal, the waveform of the first modulated signal at Point A, the waveform of the second modulated signal at Point B, the waveform of the first demodulated signal at Point C, the waveform of the second demodulated signal at Point D, and the waveform of the output signal at the output port, in FIG. 1. Although it has been described in the gate drive circuit 101 according to Embodiment 1 that the signals in the two paths (the first path which transmits the ON state of the input signal and the second path which transmits the OFF state of the input signal) are inverted to each other (that is in ON/OFF relationship or High/Low relationship), the output waveform may be changed in one cycle to allow another waveform relationship. The example includes the waveform relationships shown in FIG. 6. In FIG. 6, immediately after the first modulated signal at Point A is turned OFF from ON, the second modulated signal at Point B is turned ON, and soon after that (or after a certain time period), the modulated signal at Point B is turned OFF. Specifically, the modulated signal at Point B is turned ON, and then turned OFF again before the modulated signal at Point A is turned ON from OFF. The gate drive circuit 101 operates without any problem even with such a waveform relationship, for the following reasons.

As described above, when the output from the gate drive circuit 101 according to Embodiment 1 is turned OFF from ON, the voltage at the ground output port is made positive with respect to the voltage at the signal output port, thereby shortening the fall time. Since the fall time can be shortened by supplying the negative voltage only for a short time period during which the output is changed to OFF state from ON state, the fall time of the output of the gate drive circuit can be shortened by making the waveform of the modulated signal as shown in the timing at Point A and Point B in FIG. 6. With such a configuration, the negative voltage is not applied when the output of the gate drive circuit is changed to ON state from OFF state, thereby the rise time can be also shortened.

Embodiment 2

Next, Embodiment 2 of the gate drive circuit is described.

Figure 7:
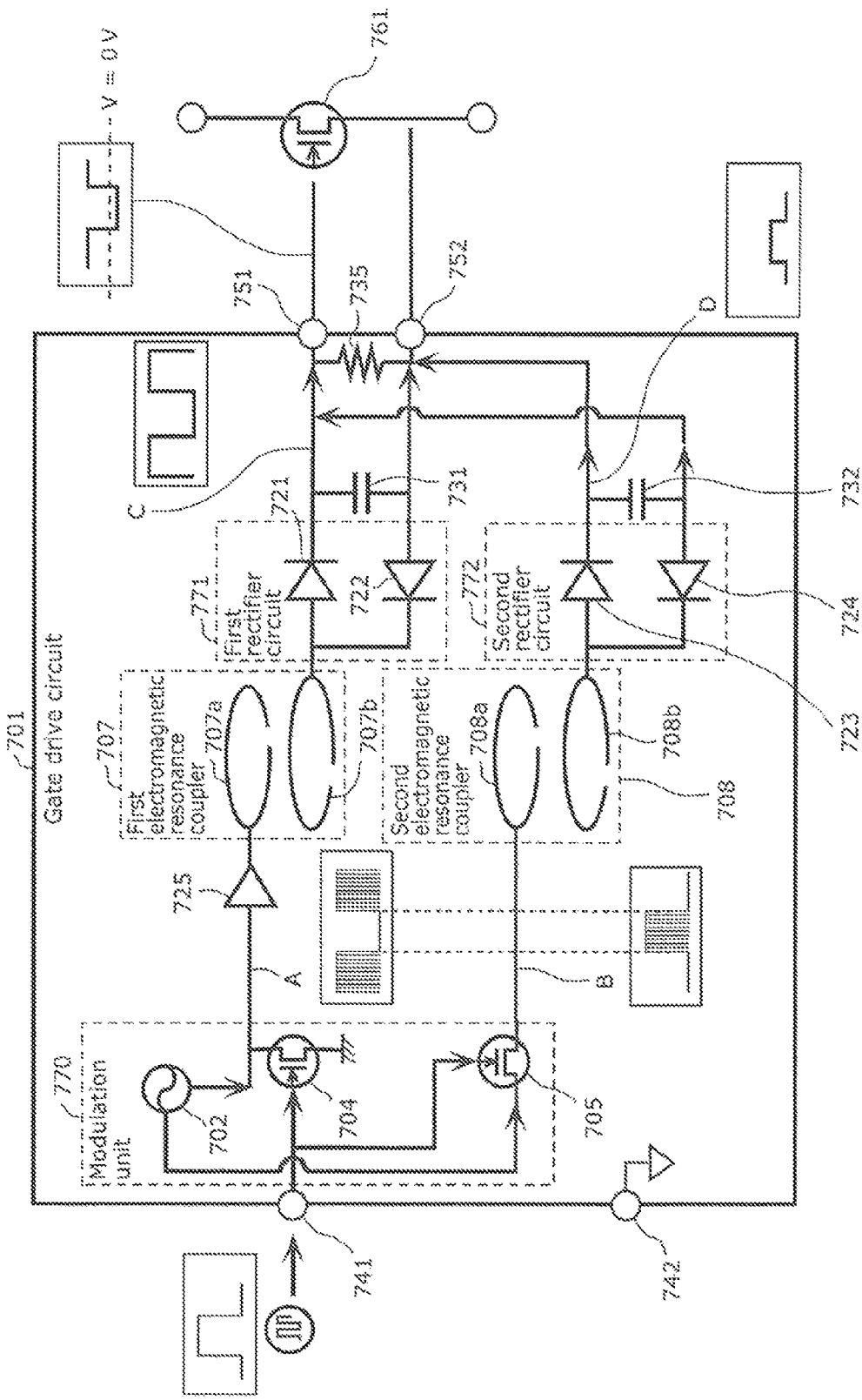
FIG. 7 is a block diagram showing a gate drive circuit according to Embodiment 2.

In the gate drive circuit 101 in Embodiment 1, the first modulated signal is generated by modulating the oscillation signal from the first oscillator circuit 102 using the first mixer circuit 104, and the second modulated signal is generated by modulating the oscillation signal from the second oscillator circuit 103 using the second mixer circuit 105. It has been described that the first mixer circuit 104 and the second mixer circuit 105 each serves as a switch circuit at this time. In Embodiment 2, a gate drive circuit 701 which includes a switch circuit instead of the mixer circuit is described with reference to the block diagram shown in FIG. 7.

The gate drive circuit 701 in Embodiment 2 includes a first switch circuit 704 and a second switch circuit 705, instead of the first mixer circuit 104 and the second mixer circuit 105 used in the gate drive circuit 101 according to Embodiment 1. Furthermore, the gate drive circuit 701 according to Embodiment 2 includes an amplifier circuit 725, and does not include the second oscillator circuit 103 but includes the first oscillator circuit 702 only. Since the switch circuit can change the input signal input, based on the control signal input, it can be said that the switch circuit is an example of the mixer circuit.

Specifically, the gate drive circuit 701 is a circuit which generates a signal for driving a gate terminal of a power semiconductor switching device 761 according to an input binary control signal, and includes an input port (a signal input port 741 and a ground input port 742), a modulation unit 770 (a first oscillator circuit 702, a first switch circuit 704, and a second switch circuit 705), an amplifier circuit 725, a first electromagnetic resonance coupler 707 (a first transmission-side resonator 707a and a first reception-side resonator 707b), a second electromagnetic resonance coupler 708 (a second transmission-side resonator 708a and a second reception-side resonator 708b), a first rectifier circuit 771 (a first positive rectifier diode 721 and a first negative rectifier diode 722), a second rectifier circuit 772 (a second positive rectifier diode 723 and a second negative rectifier diode 724), a capacitor (a first capacitor 731 and a second capacitor 732), a pull-down resistor 735, and an output port (a signal output port 751 and a ground output port 752).

Here, the first switch circuit 704 is, more specifically, a transistor which has: a gate terminal connected to the signal input port 741; a drain terminal connected to the first oscillator circuit 702; and a source terminal connected to the ground input port 742, and outputs a signal at the drain terminal as the first modulated signal. Furthermore, the second switch circuit 705 is, more specifically, a transistor which has: a gate terminal connected to the signal input port 741; a drain terminal connected to the first oscillator circuit 702; and a source terminal, and outputs a signal at the source terminal as the second modulated signal. Furthermore, the amplifier circuit 725 is a buffer amplifier which amplifies the first modulated signal and outputs the amplified first modulated signal to the first electromagnetic resonance coupler 707.

To be more specific, the signal input port 741, which receives the input signal to the gate drive circuit 701, is connected to the control terminal (gate terminal) of the first switch circuit 704 and the second switch circuit 705. The first oscillator circuit 702 is provided with two output paths. A first of the output from the first oscillator circuit 702 is connected to the first switch circuit 704 and the amplifier circuit 725, and a second of the output from the first oscillator circuit 702 is connected to the second switch circuit 705.

To be more specific, the first of the output from the first oscillator circuit 702 is connected to the drain terminal of the first switch circuit 704 and the input of the amplifier circuit 725. The output of the amplifier circuit 725 is connected to the input of the first electromagnetic resonance coupler 707 (first transmission-side resonator 707a). The source terminal of the first switch circuit 704 is connected to the ground (ground input port 742).

Furthermore, the second of the output from the first oscillator circuit 702 is connected to the drain terminal of the second switch circuit 705, and the source terminal of the second switch circuit 705 is connected to the input of the second electromagnetic resonance coupler 708. Other portions are the same as in the gate drive circuit 101 according to Embodiment 1.

The gate drive circuit 701 according to Embodiment 2 configured as above operates in the same manner as the gate drive circuit 101 according to Embodiment 1, but outputs an output signal inverted with respect to the input signal.

When the input signal is input to the signal input port 741 (in ON state (High)) of the gate drive circuit 701 according to Embodiment 2, the input signal turns ON the first switch circuit 704. At this time, the output from the first oscillator circuit 702 is connected to the ground via the first switch circuit 704, and the first oscillator circuit 702 stops outputting the oscillation signal. When the input signal is input to the second switch circuit 705 at the same time as the above, the second switch circuit 705 is turned ON and the output from the first oscillator circuit 702 is output to the second electromagnetic resonance coupler 708 via the second switch circuit 705. Therefore, the gate drive circuit 701 outputs a voltage which becomes, at the signal output port 751, negative with respect to the voltage at the ground output port 752.

In contrast, when the input signal is in OFF state (Low), the second switch circuit 705 is turned OFF and the output from the first oscillator circuit 702 is not supplied to the second electromagnetic resonance coupler 708. Since the first switch circuit 704 is turned OFF at this time, the output from the first oscillator circuit 702 is output to the amplifier circuit 725 and a positive voltage is supplied to the signal output port 751.

As described above, with the gate drive circuit 701 according to Embodiment 2, the gate drive circuit is realized in which the switch circuit such as a transistor is used as the mixer circuit of the gate drive circuit 101 according to Embodiment 1.

The amplifier circuit 725 is used for the gate drive circuit 701 in Embodiment 2. The gate drive circuit 101 according to Embodiment 1 described above may also include the amplifier circuit 725 which amplifies the signal, in the same manner as the gate drive circuit 701 according to Embodiment 2. In this case, the output of the amplifier circuit 725 may be controlled by the input signal.

Figure 8:
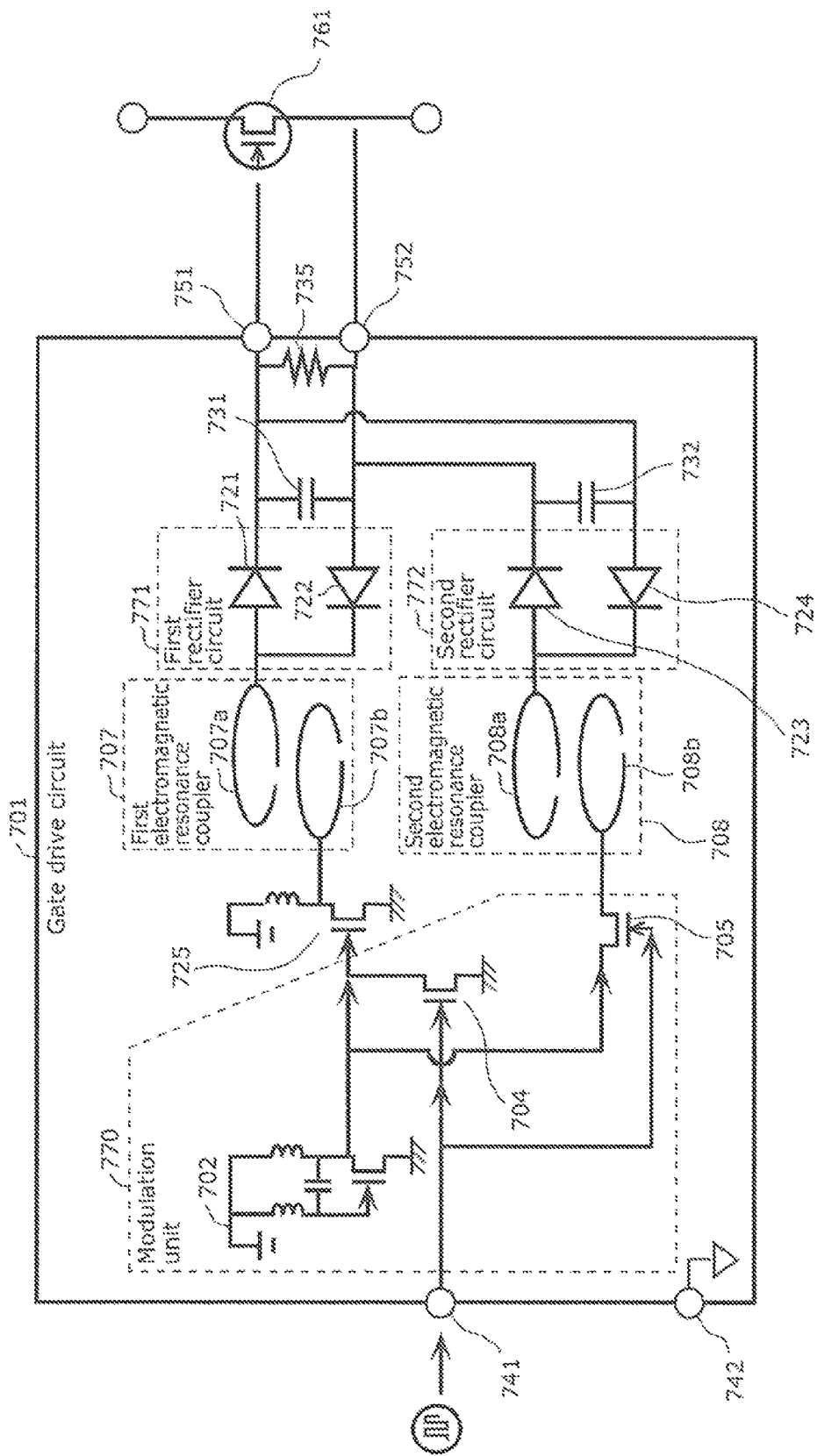
FIG. 8 is a circuit diagram showing the gate drive circuit according to Embodiment 2.

Here, a specific example of the circuit configuration for realizing Embodiment 2 is shown in FIG. 8. As shown in FIG. 8, the first oscillator circuit 702 includes two inductors connected to the power supply, a capacitor, and a transistor. The amplifier circuit 725 includes an inductor connected to the power supply and a transistor.

It is to be noted that, in FIG. 8, the following are not shown: the capacitor, the resistor and the inductance in the stages; the resistor and the capacitor added to the gate terminal, the drain terminal, and the source terminal of the switching circuit; and so on.

Figure 9:
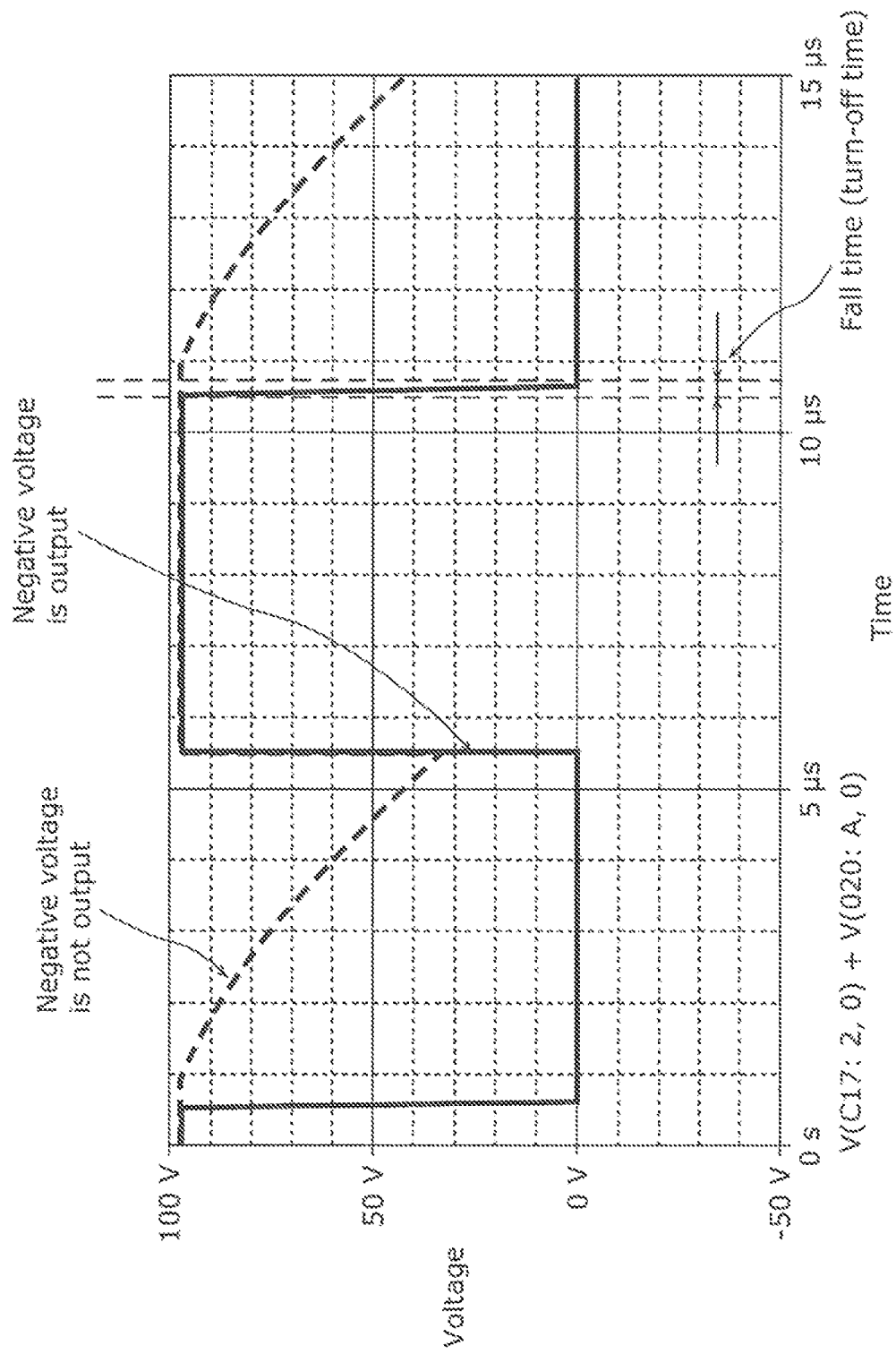
FIG. 9 shows a result of simulation on a switching voltage waveform in a power semiconductor switching device according to Embodiment 2.

FIG. 9 shows the result of a circuit simulation on an operation (waveform shown by the solid line) performed by the gate drive circuit 701 according to the present embodiment. Here, the result of the operation performed by the gate drive circuit having only one electromagnetic resonance coupler (waveform shown by the broken line) is also shown for a comparison purpose. It is to be noted that FIG. 9 shows a switching waveform at the power semiconductor switching device 761 (voltage waveform at the source terminal of the power semiconductor switching device 761) in the case where the power semiconductor switching device 761 is connected to the gate drive circuit 701 and a pulse voltage is applied to the input signal to the gate drive circuit 701, as shown in FIG. 8. Furthermore, in this simulation, a DC voltage of 100 V is applied to the drain terminal of the power semiconductor switching device 761. FIG. 9 shows: a switching waveform (solid line) of the power semiconductor switching device 761 in the case where the negative output voltage is output from the gate drive circuit; and a switching waveform (broken line) of the power semiconductor switching device 761 in the case where the negative output voltage is not output from the gate drive circuit, when the gate drive circuit is in OFF state. The case where the negative output voltage is not output indicates a gate drive circuit in which the second-system circuit (the second switch circuit 705, the second electromagnetic resonance coupler 708, the second positive rectifier diode 723, and the second negative rectifier diode 724) is not included out of the gate drive circuit 701. In this simulation, the pull-down resistor is set to 10 kΩ. As it can be understood from FIG. 9, in the gate drive circuit 701 according to Embodiment 2 (that is the waveform indicated by the solid line in FIG. 9), the power semiconductor switching device 761 switches the DC power supply in a short turn-off time and in an excellent manner, in contrast, it can be understood that when the negative output voltage is not output (that is the waveform indicated by the broken line), it takes a very long fall time and the DC power supply voltage cannot be decreased up to 0 V.

Figure 10:
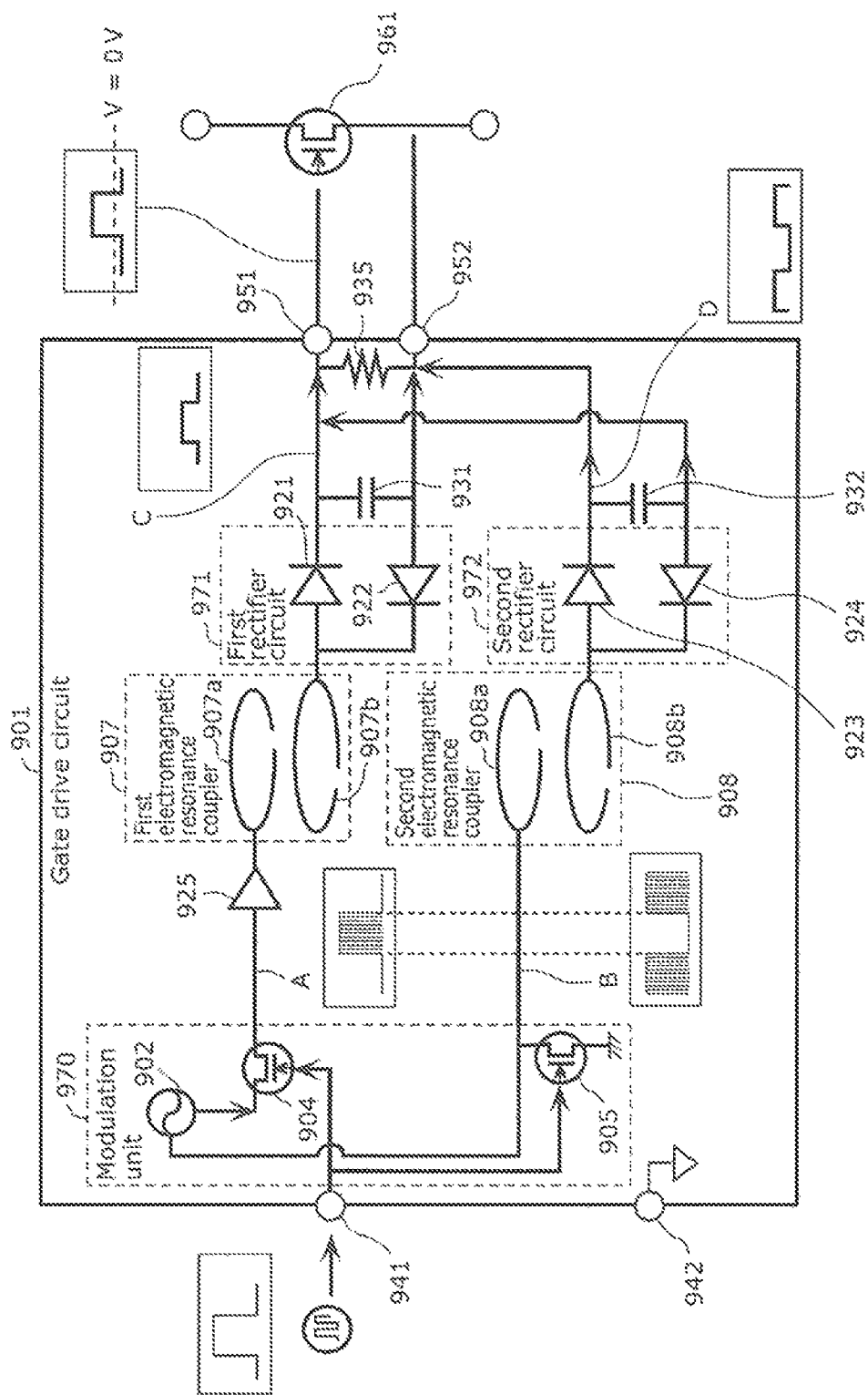
FIG. 10 is a block diagram showing the gate drive circuit according to Embodiment 2.

Furthermore, FIG. 10 shows a gate drive circuit 901 which includes the switch circuit as the mixer circuit in the same manner as in the gate drive circuit 701 according to Embodiment 2, and operates in a manner that the output signal are not inverted with respect to the input signal. The gate drive circuit 901 is a circuit which generates a signal for driving a gate terminal of a power semiconductor switching device 961 according to an input binary control signal, and includes an input port (a signal input port 941 and a ground input port 942), a modulation unit 970 (a first oscillator circuit 902, a first switch circuit 904, and a second switch circuit 905), an amplifier circuit 925, a first electromagnetic resonance coupler 907 (a first transmission-side resonator 907a and a first reception-side resonator 907b), a second electromagnetic resonance coupler 908 (a second transmission-side resonator 908a and a second reception-side resonator 908b), a first rectifier circuit 971 (a first positive rectifier diode 921 and a first negative rectifier diode 922), a second rectifier circuit 972 (a second positive rectifier diode 923 and a second negative rectifier diode 924), a capacitor (a first capacitor 931 and a second capacitor 932), a pull-down resistor 935, and an output port (a signal output port 951 and a ground output port 952).

Here, the first switch circuit 904 is, more specifically, a transistor which has a gate terminal connected to the signal input port 941, a drain terminal connected to the first oscillator circuit 902, and a source terminal, and outputs a signal at the source terminal as the first modulated signal. Furthermore, the second switch circuit 905 is, more specifically, a transistor which has a gate terminal connected to the signal input port 941, a drain terminal connected to the first oscillator circuit 902, and a source terminal connected to the ground input port 942, and outputs a signal at the drain terminal as the second modulated signal.

With the configuration shown in FIG. 10, the signal input port 941, which receives the input signal to the gate drive circuit 901, is connected to the control terminal (gate terminal) of the first switch circuit 904 and the second switch circuit 905. The first oscillator circuit 902 is provided with two output paths. A first of the output from the first oscillator circuit 902 is connected to the first switch circuit 904, and a second of the output from the first oscillator circuit 902 is connected to the second switch circuit 905 and the second electromagnetic resonance coupler 908.

Specifically, the first of the output from the first oscillator circuit 902 is connected to the drain terminal of the first switch circuit 904. The source terminal of the first switch circuit 904 is connected to the input of the amplifier circuit 925. The output of the amplifier circuit 925 is connected to the first transmission-side resonator 907a.

Furthermore, the second of the output from the first oscillator circuit 902 is connected to the drain terminal of the second switch circuit 905 and the input of the second electromagnetic resonance coupler 908 (second transmission-side resonator 908a). The source terminal of the second switch circuit 905 is connected to the ground (ground input port 942). Other portions are the same as in the gate drive circuit 701 according to Embodiment 2.

With such a configuration, the gate drive circuit 901 can be realized which operates in the same manner as the gate drive circuit 101 according to Embodiment 1 by using the switching device as the mixer circuit.

Embodiment 3

Next, Embodiment 3 of the gate drive circuit is described.

Figure 11:
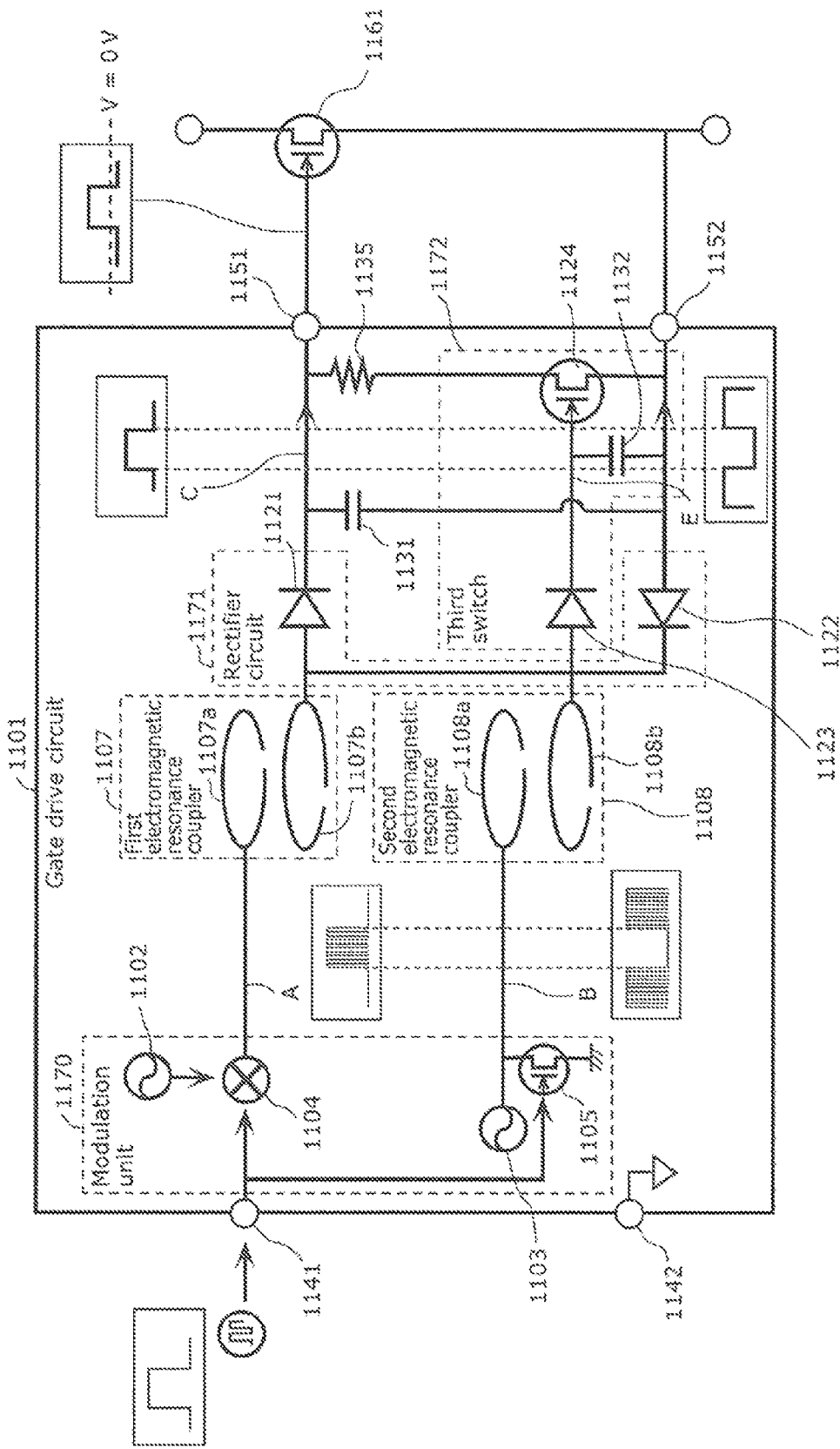
FIG. 11 is a block diagram showing a gate drive circuit according to Embodiment 3.

The following describes a gate drive circuit 1101 according to Embodiment 3 with reference to FIG. 11. The gate drive circuit 1101 according to Embodiment 3 is based on the gate drive circuit 101 according to Embodiment 1, and includes: a second switch circuit 1105 instead of the inverting circuit 106 and the second mixer circuit 105; and a circuit including a second positive rectifier diode 1123, a third switch circuit (third transistor) 1124, and a second capacitor 1132, instead of the second rectifier circuit 172.

Specifically, the gate drive circuit 1101 is a circuit which generates a signal for driving a gate terminal of a power semiconductor switching device 1161 according to an input binary control signal, and includes an input port (a signal input port 1141 and a ground input port 1142), a modulation unit 1170 (a first oscillator circuit 1102, a first mixer circuit 1104, and a second switch circuit 1105), a first electromagnetic resonance coupler 1107 (a first transmission-side resonator 1107a and a first reception-side resonator 1107b), a second electromagnetic resonance coupler 1108 (a second transmission-side resonator 1108a and a second reception-side resonator 1108b), a first rectifier circuit 1171 (a first positive rectifier diode 1121 and a first negative rectifier diode 1122), a second rectifier circuit 1172 (a second positive rectifier diode 1123, a second capacitor 1132, and a third switch circuit 1124), a capacitor (a first capacitor 1131), a pull-down resistor 1135, and an output port (a signal output port 1151 and a ground output port 1152).

The signal input port 1141, which receives the input signal to the gate drive circuit 1101 according to present embodiment 3, is connected to the control terminal (gate terminal) of the first mixer circuit 1104 and the second switch circuit 1105. The second oscillator circuit 1103 is connected to the second transmission-side resonator 1108a. The second oscillator circuit 1103 is connected to the drain terminal of the second switch circuit 1105. The source terminal of the second switch circuit 1105 is connected to the ground. The second reception-side resonator 1108b and the anode of the second positive rectifier diode 1123 are connected. The cathode terminal of the second positive rectifier diode 1123 and the control terminal (gate terminal) of the third switch circuit 1124 are connected. The drain of the third switch circuit 1124 is connected to the signal output port 1151 via the pull-down resistor 1135. The source terminal of the third switch circuit 1124 is connected to the ground output port 1152. At this time, the pull-down resistor 1135 can be very small that is 1Ω or smaller.

The following describes an operation performed by the gate drive circuit 1101 according to Embodiment 3. Here, FIG. 11 shows a waveform of an input signal, a waveform of a first modulated signal at Point A, a waveform of a second modulated signal at Point B, a waveform of a first demodulated signal at Point C, a waveform of a second demodulated signal at Point E, and a waveform of an output signal between the signal output port 1151 and the ground output port 1152. Each waveform is a voltage waveform with respect to the elapsed time. The output waveform is a voltage waveform in which the signal output port 1151 is plus with respect to the ground output port 1152.

Description is omitted on an operation in the path via the first electromagnetic resonance coupler 1107 (circuit of the first path), since it is the same as in Embodiment 1.

When the input signal is input to the signal input port 1141 of the gate drive circuit 1101 according to Embodiment 3, the input signal is input to the first mixer circuit 1104 and the gate terminal of the second switch circuit 1105 at the same time. The second switch circuit 1105 is connected to the output of the second oscillator circuit 1103. When a voltage is applied to the gate terminal of the second switch circuit 1105, the output of the second oscillator circuit 1103 is shorted to the ground. Therefore, the oscillation signal from the second oscillator circuit 1103 is blocked. Specifically, when the input signal (ON state (High)) is input to the gate terminal of the second switch circuit 1105, the output of the second oscillator circuit 1103 is stopped, and therefore the waveform of the second modulated signal at Point B has an inverted waveform of the first modulated signal at Point A. The second modulated signal modulated by the second switch circuit 1105 is input to the second electromagnetic resonance coupler 1108 and wirelessly transmitted to the second reception-side resonator 1108b. The second modulated signal output from the second reception-side resonator 1108b is rectified by the second rectifier diode 1123 and demodulated into a second demodulated signal. The second demodulated signal demodulated by the second positive rectifier diode 1123 is supplied to the gate terminal of the third switch circuit 1124, and controls ON/OFF of the third switch circuit 1124.

When an input signal (ON state (High)) is input and the output of the gate drive circuit 1101 is in the ON state, the third switch circuit 1124 is turned OFF and the resistance between the signal output port 1151 and the ground output port 1152 (that is series-connection by the pull-down resistor 1135 and the third switch circuit 1124) is infinity. Thus, the power transmitted via the first electromagnetic resonance coupler 1107 is supplied to the gate terminal of the power semiconductor switching device 1161 efficiently which allows a very short rise time. Since the power efficiency here is good, the output of the first oscillator circuit 1102 can be small and the power consumed by the gate drive circuit 1101 can be reduced.

In contrast, when the input signal is not input (that is the input signal is in the OFF state (Low)), specifically, when the output of the gate drive circuit 1101 is in the OFF state, the third switch circuit 1124 is turned ON and the signal output port 1151 and the ground output port 1152 are shorted. In this step, the charges accumulated at the first capacitor 1131 and the gate of the power semiconductor switching device 1161 are discharged via the pull-down resistor 1135. This makes it possible to shorten the fall time of the gate drive circuit 1101.

Furthermore, when the output of the gate drive circuit 1101 is changed from the OFF state to the ON state, the third switch circuit 1124 is turned OFF from ON. There is no mechanism for extracting the charges accumulated at the gate of the third switch circuit 1124 at this time, however, this brings an excellent derived effect that the charges accumulated at the gate of the third switch circuit 1124 become charges for turning ON the power semiconductor switching device 1161 and the power semiconductor switching device 1161 can be turned ON at high speed. With the above-described configuration, the resistance between the signal output port 1151 and the ground output port 1152 becomes very small due to the pull-down resistor 1135 only when the output of the gate drive circuit 1101 is in the OFF state, and the resistance becomes infinity when the output is in the ON state, which makes the rise time significantly faster.

Here, the gate drive circuit 1101 according to Embodiment 3 includes the first oscillator circuit 1102 and the second oscillator circuit 1103. However, the first oscillator circuit 1102 and the second oscillator circuit 1103 may be integrated as a single oscillator circuit. Specifically, the second oscillator circuit 1103 may be removed and the output of the first oscillator circuit 1102 may be connected to the drain terminal of the second switch circuit 1105 and the second transmission-side resonator 1108a.

[Supplemental Explanation]

Next, supplemental explanation is provided on the gate drive circuit.

Figure 12:
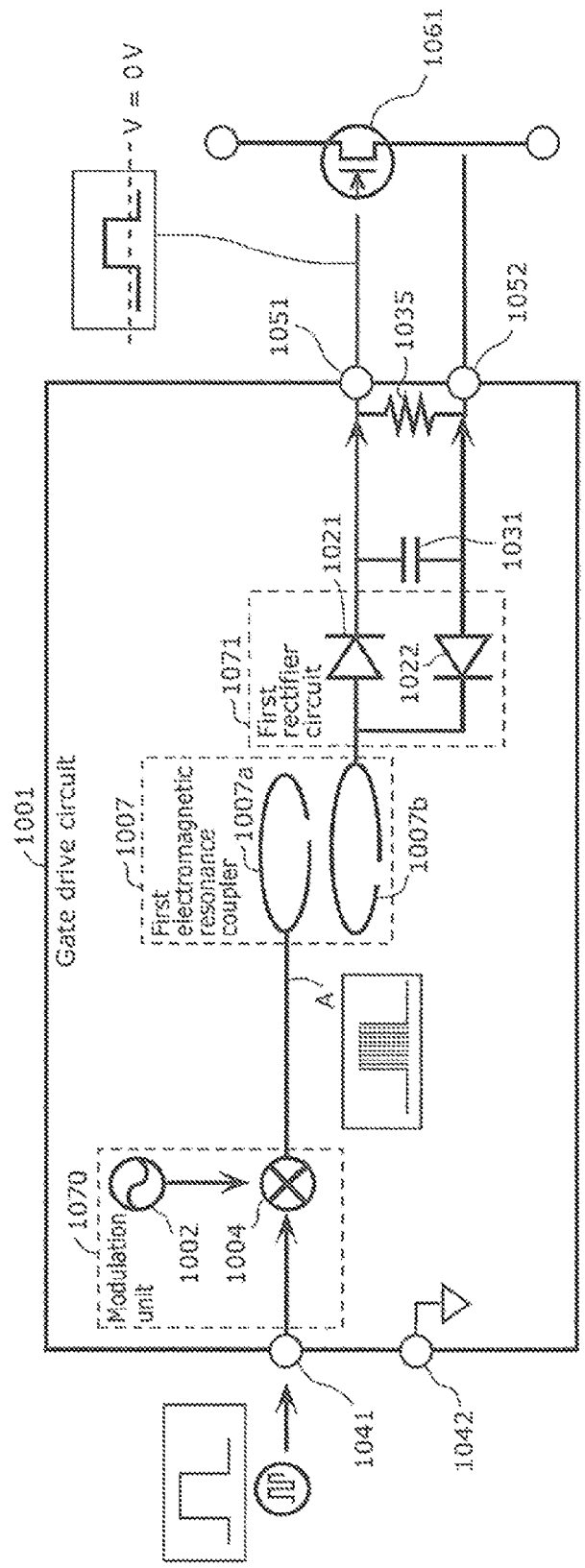
FIG. 12 is a block diagram showing a gate drive circuit according to supplementary explanation.

A gate drive circuit is described which can realize shorter fall time by wireless power transmission technique using a single electromagnetic resonance coupler, with reference to FIG. 12.

FIG. 12 is a block diagram showing a gate drive circuit 1001 according to the supplementary explanation. The gate drive circuit 1001 includes and an input port (a signal input port 1041 and a ground input port 1042), a first modulation unit 1070 (a first oscillator circuit 1002 and first mixer circuit 1004), a first electromagnetic resonance coupler 1007 (a first transmission-side resonator 1007a and a first reception-side resonator 1007b), a first rectifier circuit 1071 (a first positive rectifier diode 1021 and a first negative rectifier diode 1022), a first capacitor 1031, a pull-down resistor 1035, and an output port (a signal output port 1051 and a ground output port 1052). The gate drive circuit 1001 includes only the first-system circuit (circuit which transmits ON state of the input signal) out of the two systems in the gate drive circuit 101 according to Embodiment 1.

Specifically, the gate drive circuit 1001 is a circuit which generates a signal for driving a gate terminal of a semiconductor switching device (here, a power semiconductor switching device 1061 comprising GaN) according to an input binary control signal, and includes: (1) an input port which includes a pair of a signal input port 1041 and a ground input port 1042 for receiving the control signal; (2) an output port which includes a pair of a signal output port 1051 and a ground output port 1052, the ground output port 1052 being electrically isolated from the ground input port 1042; (3) a capacitor (a first capacitor 1031) connected between the signal output port 1051 and the ground output port 1052; (4) a modulation unit 1070 which includes at least one oscillator circuit (here, a first oscillator circuit 1002) and modulates an oscillation signal output from the oscillator circuit using the control signal input to the input port to generate a first modulated signal indicating timing of a first logical value of the control signal; (5) a first electromagnetic resonance coupler 1007 which includes a first transmission-side resonator 1007a and a first reception-side resonator 1007b coupled by electromagnetic field resonance and is connected to the modulation unit 1070 to cause the first modulated signal to be input to the first transmission-side resonator 1007a; (6) a first rectifier circuit 1071 which includes at least one diode (here, a first positive rectifier diode 1021 and a first negative rectifier diode 1022) connected to the first reception-side resonator 1007b, generates a first demodulated signal by demodulating the first modulated signal, and outputs the first demodulated signal to the output port; and (7) a pull-down resistor 1035 connected between a signal output port 1051 and a ground output port 1052).

The gate control signal such as PWM is input to the signal input port of the gate drive circuit 1001. The power semiconductor switching device 1061 is connected to the output port of the gate drive circuit 1001. The signal output port 1051 and the ground output port 1052 in FIG. 12 are included in the output port. The signal output port 1051 is connected to the gate terminal of the power semiconductor switching device 1061, and the ground output port 1052 is connected to the source terminal of the power semiconductor switching device 1061. The gate drive circuit 1001 causes a voltage to be generated at the gate of the power semiconductor switching device 1061 according to the input signal, and controls ON/OFF of the power semiconductor switching device 1061.

The signal input port of the gate drive circuit 1001 is connected to the input of the first mixer circuit 1004. The first oscillator circuit 1002 is connected to the input of the first mixer circuit 1004. The output of the first mixer circuit 1004 is connected to the input of the first electromagnetic resonance coupler 1007. The output of the first electromagnetic resonance coupler 1007 is connected to the anode of the first positive rectifier diode 1021 and the cathode of the first negative rectifier diode 1022. The cathode of the first positive rectifier diode 1021 is connected to the signal output port 1051. The anode of the first negative rectifier diode 1022 is connected to the ground output port 1052. Furthermore, the first capacitor 1031 and the pull-down resistor 1035 are connected between the signal output port 1051 and the ground output port 1052.

When the input signal is input to the gate drive circuit 1001, the input signal and the oscillation signal from the first oscillator circuit 1002 are mixed by the first mixer circuit 1004, and the first modulated signal is output to the output (Point A) of the first mixer circuit 1004. Since the first modulated signal is a signal oscillated by the first oscillator circuit 1002 and has a high frequency, the first modulated signal passes through the first electromagnetic resonance coupler 1007 and is wirelessly output to the first reception-side resonator 1007b. The first modulated signal transmitted wirelessly is rectified and demodulated by the first positive rectifier diode 1021 and the first negative rectifier diode 1022, and is output as a voltage which becomes positive at the signal output port 1051. In this way, the gate drive circuit 1001 outputs the same waveform as that of the input signal, and controls ON and OFF of the power semiconductor switching device 1061. Such a gate drive circuit 1001 can generate gate power in a state where the input and output are isolated.

Here, in the case where the pull-down resistor 1035 is not provided, when the output of the gate drive circuit 1001 is in the OFF state, the gate resistance of the power semiconductor switching device 1061 is very high and it takes time to discharge the charges accumulated at the first capacitor 1031 or the power semiconductor switching device 1061, which causes the output signal of the gate drive circuit 1001 to take a long fall time.

In contrast, with the gate drive circuit 1001, when the input signal which has been input is in the OFF state, that is when the output of the gate drive circuit 1001 is in the OFF state, the signal output port 1051 and the ground output port 1052 are connected by the pull-down resistor 1035, which allows the charges accumulated at the first capacitor 1031 or the gate of the power semiconductor switching device 1061 to be discharged via the pull-down resistor 1035. Thus, the gate drive circuit 1001 can be realized which includes the electromagnetic resonance coupler having a feature of short fall time.

It is beneficial that the pull-down resistor 1035 approximates the resistance of the gate resistance when the connected power semiconductor switching device 1061 is ON. An example of a specific value is approximately 50Ω to 1000Ω. Here, in the case where the pull-down resistor 1035 is too small, the pull-down resistor 1035 consumes power. Therefore, large power is required to be supplied via the first electromagnetic resonance coupler 1007, in contrast, in the case where the pull-down resistor 1035 is large, longer fall time is required. The pull-down resistor 1035 can be controlled using the configuration shown in Embodiment 3.

Figure 13:
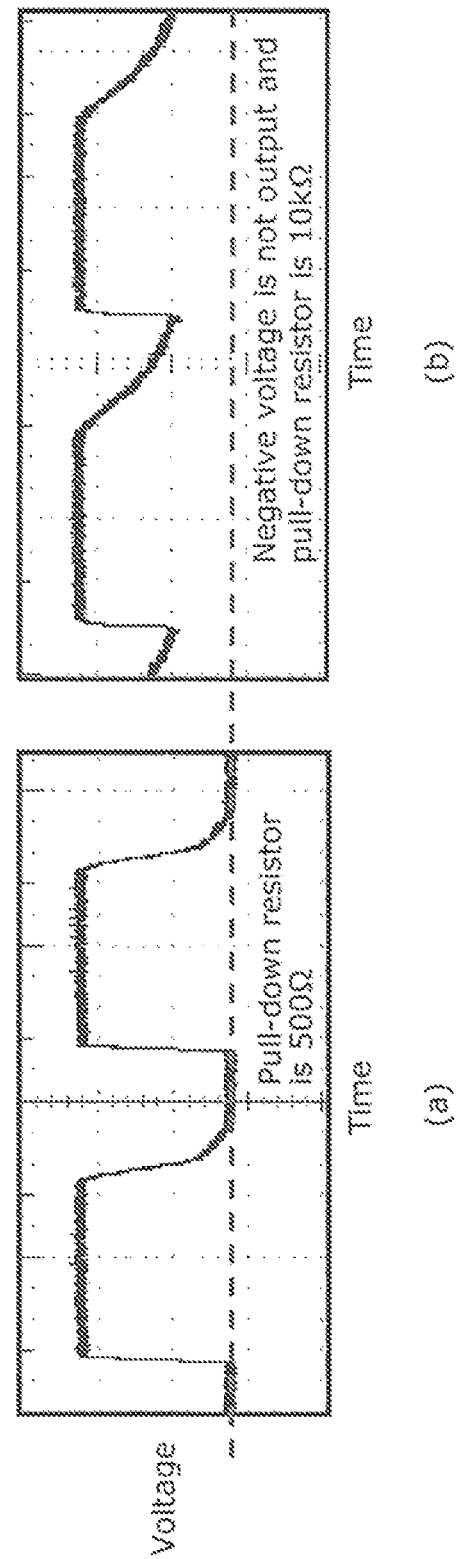
FIG. 13 shows a switching voltage waveform in a power semiconductor switching device according to the supplementary explanation.
Figure 14:
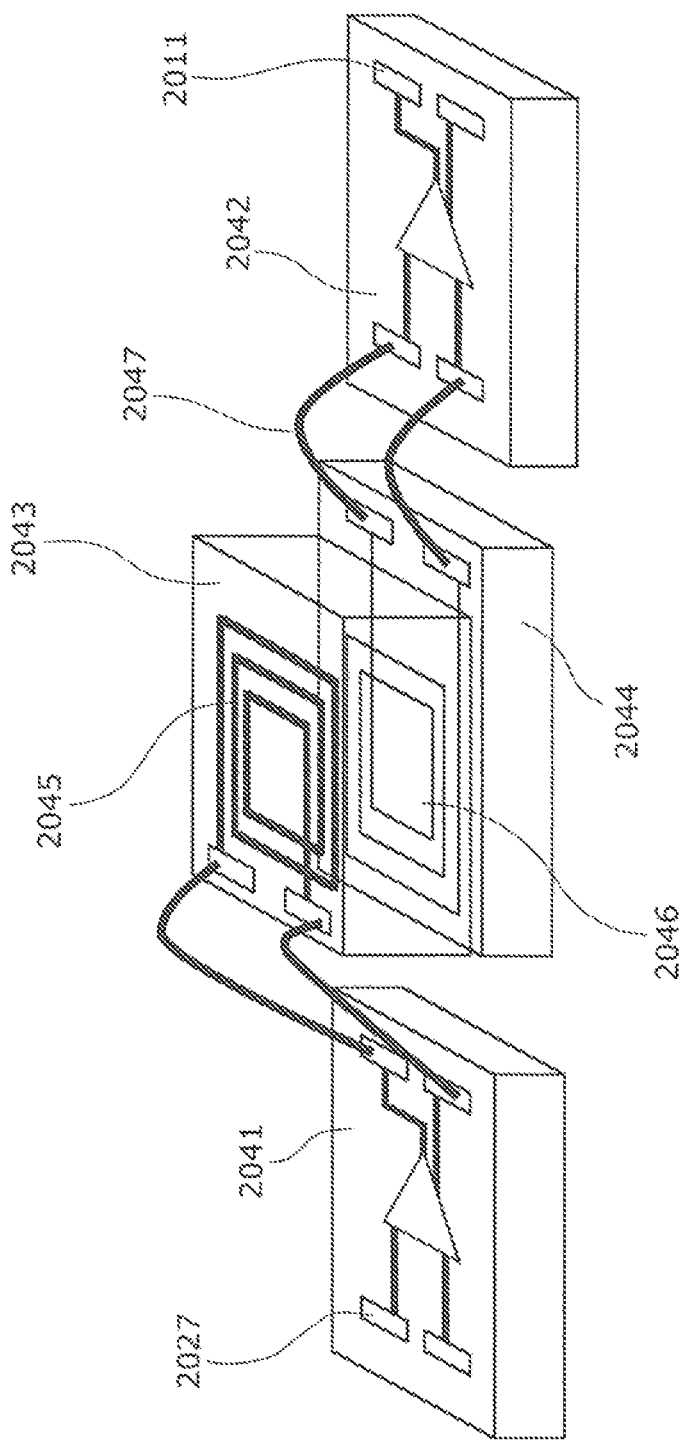
FIG. 14 shows a schematic view of a conventional signal transmission apparatus.

FIG. 13 shows a switching voltage waveform of the power semiconductor switching device comprising GaN (voltage waveform of the source terminal of the power semiconductor switching device) seen when the power semiconductor switching device is actually driven by the gate drive circuit 1001 according to this supplemental explanation. Here, the switching voltage waveform seen when the pull-down resistor 1035 takes two types of value is shown. It can be understood that, in the gate drive circuit 1001, when the pull-down resistor 1035 is set to 500Ω, the fall time is shortened and good switching is realized ((a) in FIG. 13). However, it can be understood that, when the pull-down resistor is set to 10 kΩ, the fall time is significantly long and the direct current cannot be switched ((b) in FIG. 13).

As it can be understood from the gate drive circuit 1001 according to the supplemental explanation, the fall time of the output signal of the gate drive circuit 1001 can be shortened by connecting the pull-down resistor 1035 having an appropriate resistance between the signal output port 1051 and the ground output port 1052.

The foregoing has described the gate drive circuit based on Embodiments 1 to 3 and the modifications. However, the present disclosure is not limited to the embodiments and the modifications. Embodiments obtained by applying various modifications conceived by those skilled in the art to the above embodiment and the modifications, or embodiments structured by arbitrarily combining constituents of the embodiment and the modifications, within a scope that does not deviate from the spirit of the present invention, are also included within the scope of the present invention.

For example, although the modulation unit 1170 in Embodiment 3 includes the first oscillator circuit 1102, the first mixer circuit 1104, and the second switch circuit 1105, the modulation unit 1170 may be the same as one of other modulation units 170, 370, 470, 570, 770, 870, and 970.

Furthermore, although the input signal input from the signal input port is directly input to the mixer circuit or the switch circuit in the embodiments, a buffer circuit may be provided between the signal input port and the mixer circuit or the switch circuit for the purpose of increasing the voltage of the input signal, for example.

It has been described that the amplifier circuit, the first switch circuit, the second switch circuit, the third switch circuit, and the power semiconductor switching device are field effect transistors each having a gate terminal, a source terminal, and a drain terminal in the embodiments. However, another transistor may be used such as a bipolar transistor having a base terminal, an emitter terminal, and a collector terminal.

Furthermore, the gate drive circuit according to the present embodiments may be implemented as a single semiconductor chip including the semiconductor switching device.

Although the pull-down resistor is described as a fixed resistor in the embodiments, the pull-down resistor of a controlling resistor such as a memoristor may be used.

Furthermore, the system according to the embodiments is very effective when the gate drive circuit is realized by the wireless power transmission using the electromagnetic resonance coupler.

Furthermore, the gate drive circuit capable of performing wireless power transmission using the electromagnetic resonance coupler according to the embodiments is very effective when the nitride semiconductor power semiconductor switching device is driven, since power for driving the gate can be supplied directly without using an external isolated power supply due to the small gate voltage and the gate current.

The nitride semiconductor power semiconductor switching device (FET) such as the gate injection transistor (GIT) has a disadvantage in that the charges at the gate do not disappear easily. Therefore, this configuration is particularly effective for driving a nitride semiconductor power semiconductor switching device.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

INDUSTRIAL APPLICABILITY

The present disclosure is useful as a gate drive circuit which drives a semiconductor switching device, and the use of the electromagnetic resonance coupler makes it useful especially as a gate drive circuit for a wireless power transmission apparatus, an electric DC isolation device, and a signal-isolation gate drive element for driving a power semiconductor switching device with lower power consumption and at higher speed.

The invention claimed is:

1. A gate drive circuit which generates a signal for driving a gate terminal of a semiconductor switching device according to an input binary control signal, the gate drive circuit comprising:
  an input port which includes a pair of a signal input port and a ground input port for receiving the control signal;
  an output port which includes a pair of a signal output port and a ground output port, the ground output port being electrically isolated from the ground input port;
  a capacitor connected between the signal output port and the ground output port;
  a modulation unit which includes at least one oscillator circuit and is configured to modulate an oscillation signal output from the oscillator circuit using the control signal input to the input port to generate (i) a first modulated signal indicating timing of a first logical value of the control signal and (ii) a second modulated signal indicating timing of at least a second logical value of the control signal;
  a first electromagnetic resonance coupler which includes a first transmission-side resonator and a first reception-side resonator coupled by electromagnetic field resonance and is connected to the modulation unit to cause the first modulated signal to be input to the first transmission-side resonator;
  a second electromagnetic resonance coupler which includes a second transmission-side resonator and a second reception-side resonator coupled by electromagnetic field resonance and is connected to the modulation unit to cause the second modulated signal to be input to the second transmission-side resonator;

a first rectifier circuit which includes at least one diode connected to the first reception-side resonator, generates a first demodulated signal by demodulating the first modulated signal, and outputs the first demodulated signal to the output port; and a second rectifier circuit which includes at least one diode connected to the second reception-side resonator, generates a second demodulated signal by demodulating the second modulated signal, and outputs the second demodulated signal to the output port.

2. The gate drive circuit according to claim 1,
wherein the modulation unit further includes a first mixer circuit and a second mixer circuit which are connected to the signal input port,
the first mixer circuit generates the first modulated signal by modulating the oscillation signal output from the oscillator circuit using the control signal input to the input port, and
the second mixer circuit generates the second modulated signal by modulating the oscillation signal output from the oscillator circuit using the control signal input to the input port.

3. The gate drive circuit according to claim 2,
wherein the modulation unit further includes an inverting circuit connected between the signal input port and the second mixer circuit.

4. The gate drive circuit according to claim 2,
wherein the modulation unit includes, as the at least one oscillator circuit, a first oscillator circuit and a second oscillator circuit, the first mixer circuit modulates the oscillation signal output from the first oscillator circuit using the control signal, and
the second mixer circuit modulates the oscillation signal output from the second oscillator circuit using the control signal.

5. The gate drive circuit according to claim 4,
wherein the oscillation signal output from the first oscillator circuit has a frequency different from a frequency of the oscillation signal output from the second oscillator circuit.

6. The gate drive circuit according to claim 2,
wherein at least one of the first mixer circuit and the second mixer circuit is a switch circuit which turns ON and OFF according to the control signal.

7. The gate drive circuit according to claim 6,
wherein the switch circuit included in the first mixer circuit is a first transistor which has a gate terminal connected to the signal input port, a drain terminal connected to the oscillator circuit, and a source terminal connected to the ground input port, and outputs a signal at the drain terminal as the first modulated signal, and
the switch circuit included in the second mixer circuit is a second transistor which has a gate terminal connected to the signal input port, a drain terminal connected to the oscillator circuit, and a source terminal, and outputs a signal at the source terminal as the second modulated signal.

8. The gate drive circuit according to claim 6,
wherein the switch circuit included in the first mixer circuit is a first transistor which has a gate terminal connected to the signal input port, a drain terminal connected to the oscillator circuit, and a source terminal, and outputs a signal at the source terminal as the first modulated signal, and
the switch circuit included in the second mixer circuit is a second transistor which has a gate terminal connected to the signal input port, a drain terminal connected to the oscillator circuit, and a source terminal connected to the ground input port, and outputs a signal at the drain terminal as the second modulated signal.

9. The gate drive circuit according to claim 1,
wherein the modulation unit further includes a path changing circuit which selects one of two output paths for the oscillation signal output from the oscillator circuit based on the control signal input to the signal input port, and
the path changing circuit outputs the oscillation signal for which a first of the two output paths is selected as the first modulated signal and outputs the oscillation signal for which a second of the two output paths is selected as the second modulated signal.

10. The gate drive circuit according to claim 1,
wherein the modulation unit further includes a first mixer circuit which modulates the oscillation signal output from the oscillator circuit using the control signal input to the signal input port, outputs the modulated signal obtained by the first mixer circuit as the first modulated signal, and outputs the oscillation signal output from the oscillator circuit as the second modulated signal.

11. The gate drive circuit according to claim 1, further comprising
a resistor connected between the signal output port and the ground output port.

12. The gate drive circuit according to claim 1,
wherein the at least one oscillator circuit is an oscillator which outputs a differential signal including a first oscillation signal and a second oscillation signal, and
the modulation unit is configured to modulate the first oscillation signal using the control signal to generate the first modulated signal, and modulate the second oscillation signal using the control signal to generate the second modulated signal.

13. The gate drive circuit according to claim 1, further comprising
an amplifier circuit which amplifies the first modulated signal,
wherein the first electromagnetic resonance coupler is connected to the modulation unit via the amplifier circuit to cause the first modulated signal amplified by the amplifier circuit to be input to the first transmission-side resonator.

14. The gate drive circuit according to claim 1,
wherein the first rectifier circuit includes, as the at least one diode, at least one of (i) a first positive rectifier diode having an anode connected to the first reception-side resonator and a cathode connected to the signal output port and (ii) a first negative rectifier diode having an anode connected to the ground output port and a cathode connected to the first reception-side resonator, and
the second rectifier circuit includes, as the at least one diode, at least one of (i) a second positive rectifier diode having an anode connected to the second reception-side resonator and a cathode connected to the signal output port and (ii) a second negative rectifier diode having an anode connected to the ground output port and a cathode connected to the second reception-side resonator.

15. The gate drive circuit according to claim 14,
wherein the first rectifier circuit further includes at least one of (i) a third positive rectifier diode having an anode connected to a ground of the first reception-side resonator and a cathode connected to the signal output port, (ii) a third negative rectifier diode having an anode connected to the ground output port and a cathode connected to the ground of the first reception-side resonator, and (iii) a wire which connects the ground of the first reception-side resonator to the signal output port or the ground output port, and the second rectifier circuit further includes at least one of (i) a fourth positive rectifier diode having an anode connected to a ground of the second reception-side resonator and a cathode connected to the signal output port, (ii) a fourth negative rectifier diode having an anode connected to the ground output port and a cathode connected to the ground of the second reception-side resonator, and (iii) a wire which connects the ground of the second reception-side resonator to the signal output port or the ground output port.

16. The gate drive circuit according to claim 1,
wherein the second rectifier circuit includes: a second positive rectifier diode as the at least one diode, a second capacitor, and a third transistor,
the anode of the second positive rectifier diode is connected to the second reception-side resonator, the cathode of the second positive rectifier diode is connected to a first end of the second capacitor and a gate terminal of the third transistor,
the third transistor is connected between the signal output port and the ground output port, and
a second end of the second capacitor and a source terminal of the third transistor are connected to the ground output port.

17. The gate drive circuit according to claim 1,
wherein the first electromagnetic resonance coupler and the second electromagnetic resonance coupler are open-ring electromagnetic resonance couplers.

18. The gate drive circuit according to claim 1,
wherein the output port outputs an ON signal for turning ON the semiconductor switching device and an OFF signal for turning OFF the semiconductor switching device, according to the logical value of the control signal,
the ON signal causes a potential at the signal output port to be higher than a potential at the around output port, and
the OFF signal causes a potential at the signal output port to be lower than a potential at the ground output port.

19. The gate drive circuit according to claim 1,
wherein a voltage between the signal output port and the ground output port becomes zero immediately before the output port outputs the ON signal.

20. The gate drive circuit according to claim 1, further comprising
the semiconductor switching device,
wherein the signal output port is connected to a gate terminal of the semiconductor switching device, and
the ground output port is connected to a source terminal of the semiconductor switching device.

21. The gate drive circuit according to claim 20,
wherein the semiconductor switching device is a nitride semiconductor.

* * * * *